(12) United States Patent
Hamada et al.

(10) Patent No.: US 7,598,666 B2
(45) Date of Patent: Oct. 6, 2009

(54) ORGANIC ELECTROLUMINESCENT DEVICE AND LUMINESCENT MATERIAL

(75) Inventors: Yuji Hamada, Nara (JP); Tsuyoshi Tsujioka, Osaka (JP)

(73) Assignee: Sanyo Electric Co., Ltd., Osaka (JP)

( * ) Notice: Subject to any disclaimer, the term of this patent is extended or adjusted under 35 U.S.C. 154(b) by 533 days.

(21) Appl. No.: 10/479,734

(22) PCT Filed: Jun. 4, 2002

(86) PCT No.: PCT/JP02/05522

§ 371 (c)(1),
(2), (4) Date: Nov. 18, 2004

(87) PCT Pub. No.: WO02/100977

PCT Pub. Date: Dec. 19, 2002

(65) Prior Publication Data

US 2005/0079381 A1    Apr. 14, 2005

(30) Foreign Application Priority Data

Jun. 6, 2001  (JP) .............................. 2001-171664
Jun. 3, 2002  (JP) .............................. 2002-161323

(51) Int. Cl.
*H01L 51/54*  (2006.01)
*H01L 51/50*  (2006.01)
*H05B 33/14*  (2006.01)
*C09K 11/06*  (2006.01)

(52) U.S. Cl. ................ 313/504; 313/506; 428/690; 428/917; 257/40; 257/E51.049; 257/E51.05

(58) Field of Classification Search .............. None
See application file for complete search history.

(56) References Cited

U.S. PATENT DOCUMENTS 5,601,903 A * 2/1997 Fujii et al. .................. 428/212
5,989,737 A   11/1999 Xie et al.

(Continued)

FOREIGN PATENT DOCUMENTS

CN        1342190 A       3/2002

(Continued)

OTHER PUBLICATIONS

European Search Report Issued in European Patent Application No. EP 02 73 3300, dated Mar. 27, 2007.

(Continued)

*Primary Examiner*—D. Lawrence Tarazano
*Assistant Examiner*—Brett A Crouse
(74) *Attorney, Agent, or Firm*—McDermott Will & Emery LLP

(57) ABSTRACT

An organic EL device is provided which is capable of providing high luminance and high luminous efficiency. In an organic EL device, a hole injecting electrode lies on a glass substrate, and a hole injecting layer, a hole transporting layer, and a light emitting layer are sequentially formed thereon. An electron injecting electrode lies on the light emitting layer. The light emitting layer contains a host material, a light emitting dopant, and a first light-emission assisting dopant. The first light-emission assisting dopant is composed of a rubrene derivative.

8 Claims, 2 Drawing Sheets

U.S. PATENT DOCUMENTS

| | | |
|---|---|---|
| 6,339,290 B1 * | 1/2002 | Nakaya .................. 313/506 |
| 6,387,546 B1 | 5/2002 | Hamada et al. |
| 6,387,547 B1 * | 5/2002 | Fujita et al. ............. 428/690 |
| 6,399,223 B1 | 6/2002 | Fujita et al. |
| 6,436,558 B1 | 8/2002 | Sato et al. |
| 2004/0016907 A1 * | 1/2004 | Shi ..................... 252/301.16 |

FOREIGN PATENT DOCUMENTS

| | | |
|---|---|---|
| EP | 0982783 | 3/2000 |
| EP | 1156536 | 11/2001 |
| EP | 1 182 244 A1 | 2/2002 |
| EP | 1182244 A1 | 2/2002 |
| JP | 4-335087 A | 11/1992 |
| JP | 6-228555 | 8/1994 |
| JP | 6-228556 | 8/1994 |
| JP | 6-330032 | 11/1994 |
| JP | 6330032 | 11/1994 |
| JP | 10-36832 | 2/1998 |
| JP | 10-36832 A | 2/1998 |
| JP | 10-255985 | 9/1998 |
| JP | 10-289786 | 10/1998 |
| JP | 10289786 | 10/1998 |
| JP | 11-273861 A | 10/1999 |
| JP | 2000-26337 A | 1/2000 |
| JP | 2000-28337 A | 1/2000 |
| JP | 2000-113985 | 4/2000 |
| JP | 2000-164362 A | 6/2000 |
| JP | 2000-178548 | 6/2000 |
| JP | 2000-178548 A | 6/2000 |
| JP | 2000-268964 A | 9/2000 |
| JP | 2001-052870 | 2/2001 |
| JP | 2001052870 | 2/2001 |
| JP | 2001-102172 | 4/2001 |
| JP | 2001-102172 A | 4/2001 |
| JP | 2001-131434 | 5/2001 |
| JP | 2001-131434 | 5/2001 |
| JP | 2001-250690 A | 9/2001 |
| JP | 2001-297883 A | 10/2001 |
| JP | 2002-93581 A | 3/2002 |
| JP | 2002-167578 A | 6/2002 |
| KR | 2001102413 A | 11/2001 |
| WO | WO 99/57220 | 11/1999 |
| WO | WO 99/57220 A1 | 11/1999 |
| WO | WO 01/48116 A1 | 7/2001 |

OTHER PUBLICATIONS

Adachi, Chihaya., et al. "Organic electroluminescent device having a hole conductor as an emitting layer." Appl. Phys. Lett., vol. 55, pp. 1489-1491 (1989).

Tang, C.W., et al. "Organic electroluminescent diodes," Appl. Phys. Lett, vol. 51, pp. 913-915 (1987).

Vanslyke, S.A., et al. "Organic electroluminescent devices with improved stability," Appl. Phys. Lett., vol. 69, pp. 2160-2162 (1996).

Japanese Office Action issued in Japanese Patent Application No. JP 2002-161323, mailed Jul. 3, 2007.

* cited by examiner

ORGANIC ELECTROLUMINESCENT DEVICE AND LUMINESCENT MATERIAL

TECHNICAL FIELD

The present invention relates to an organic electroluminescent device and luminescent material.

BACKGROUND ART

Organic electroluminescent devices (hereinafter referred to as organic EL devices) are new self-emitting devices of great prospects. The organic EL devices have a stacked structure in which a carrier transporting layer (an electron or hole transporting layer) and a light emitting layer are sandwiched between a hole injecting electrode and an electron injecting electrode.

An electrode material having a large work function, such as gold or ITO (indium-tin oxide), is used to form the hole injecting electrode, and an electrode material having a small work function, such as Mg (magnesium) or Li (lithium), is used to form the electron injecting electrode.

The hole transporting layer, light emitting layer, and electron transporting layer are formed of organic materials. A material having p-type semiconductor properties is used to form the hole transporting layer and a material having n-type semiconductor properties is used to form the electron transporting layer. The light emitting layer is formed of a fluorescent or phosphorescent organic material which, too, has a carrier transporting property, as an electron or hole transporting property.

The hole injecting electrode, hole transporting layer, light emitting layer, electron transporting layer, and electron injecting electrode are stacked in this order to form an organic EL device.

The functional layers, i.e. the hole transporting layer, electron transporting layer, and light emitting layer, may each be composed of a plurality of layers, or may be omitted, depending on the organic materials used.

For example, Chihaya Adachi et al., Appl. Phys. Lett., Vol. 55, pp. 1489-1491 (1989) discloses a device structure that has only two organic layers, light emitting and electron transporting layers, between the hole injecting electrode and electron injecting electrode. In this device, the light emitting layer made of a luminescent material called NSD has a good hole transporting property, so that the light emitting layer can act also as a hole transporting layer.

C. W. Tang et al., Appl. Phys. Lett., Vol. 51, pp. 913-915 (1987) discloses a device structure that has two organic layers: hole transporting and light emitting layers. In this case, tris(8-hydroxyquinolinato)aluminum (hereinafter referred to as Alq) in the light emitting layer performs two functions: light emitting and electron transporting functions.

S. A. VanSlyke et al., Appl. Phys. Lett., Vol. 69, pp. 2160-2162 (1996) discloses a device structure that has three organic layers: a hole injecting layer, hole transporting layer, and light emitting layer. In this case, the hole injecting layer, made of copper phthalocyanine, serves like a hole transporting layer; thus the entire device includes two hole transporting layers.

In this way, the stacked structure of the electron transporting layer, hole transporting layer and light emitting layer can be freely designed, depending on the organic materials used.

Organic EL devices can be used to obtain visible light from blue to red, by properly selecting organic material of the light emitting layer. Therefore a full-color display can be implemented by using monochromatic organic EL devices individually emitting red, green or blue light, i.e. the three primary colors of light (RGB).

Among red, green and blue lights obtained with organic EL devices, green light and blue light are stable. On the other hand, it is difficult to obtain light with high luminance and high luminous efficiency in the range from red to orange. Therefore developing full-color displays requires red-emitting organic EL devices with good color purity, high luminous efficiency, and high luminance.

JP2000-164362, A suggests a method in which rubrene having the molecular structure represented by Formula (15) below is used as a light-emission assisting dopant. While this method offers improved red color purity, it fails to provide sufficient luminous efficiency and sufficient luminance.

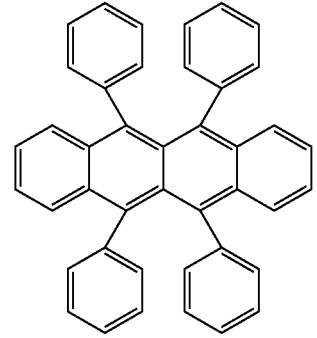

(15)

RUBRENE

DISCLOSURE OF THE INVENTION

An object of the invention is to provide an organic EL device capable of providing high luminance and high luminous efficiency.

Another object of the invention is to provide a luminescent material capable of providing high luminance and high luminous efficiency.

According to one aspect of the invention, an organic electroluminescent device includes a hole injecting electrode, an electron injecting electrode, and a light emitting layer provided between the hole injecting electrode and the electron injecting electrode, wherein the light emitting layer contains a rubrene derivative having a molecular structure represented by Formula (1):

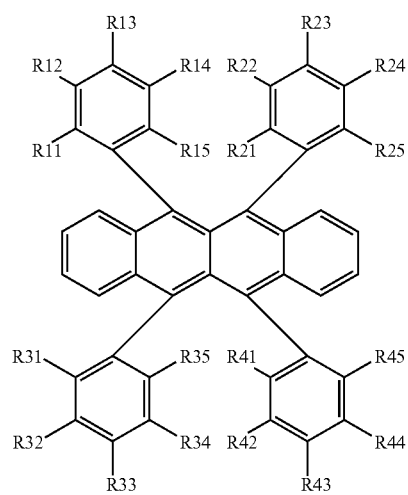

(1)

wherein R11-R15, R21-R25, R31-R35 and R41-R45 are the same or different and each represent a hydrogen atom or a substituent, where the structure in which all are hydrogen atoms is excluded. Adjacent two of R11-R15, adjacent two of R21-R25, adjacent two of R31-R35, and adjacent two of R41-R45 may be bonded together to form rings. Adjacent three of R11-R15, adjacent three of R21-R25, adjacent three of R31-R35, and adjacent three of R41-R45 may be bonded together to form rings.

Because the light emitting layer contains a rubrene derivative having a molecular structure represented by Formula (1), the organic electroluminescent device of the invention provides high luminance and high luminous efficiency.

According to another aspect of the invention, an organic electroluminescent device includes a hole injecting electrode, an electron injecting electrode, and a light emitting layer provided between the hole injecting electrode and the electron injecting electrode, wherein the light emitting layer contains a rubrene derivative having a molecular structure represented by Formula (2):

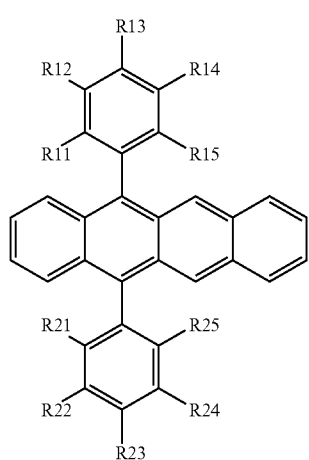

(2)

wherein R11-R15 and R21-R25 are the same or different and each represent a hydrogen atom or a substituent. Adjacent two of R11-R15 and adjacent two of R21-R25 may be bonded together to form rings. Adjacent three of R11-R15 and adjacent three of R21-R25 may be bonded together to form rings.

Because the light emitting layer contains a rubrene derivative having a molecular structure represented by Formula (2), the organic electroluminescent device of the invention provides high luminance and high luminous efficiency.

According to still another aspect of the invention, an organic electroluminescent device includes a hole injecting electrode, an electron injecting electrode, and a light emitting layer provided between the hole injecting electrode and the electron injecting electrode, wherein the light emitting layer contains a rubrene derivative having a molecular structure represented by Formula (3):

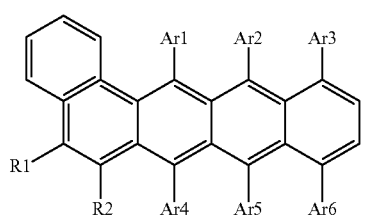

(3)

wherein Ar1-Ar6 are the same or different and each represent a hydrogen atom or a substituent. R1 and R2 are the same or different and each represent a hydrogen atom or a substituent. Adjacent R1 and R2 may be bonded together to form a ring.

Because the light emitting layer contains a rubrene derivative having a molecular structure represented by Formula (3), the organic electroluminescent device of the invention provides high luminance and high luminous efficiency.

According to a further aspect of the invention, an organic electroluminescent device includes a hole injecting electrode, an electron injecting electrode, and a light emitting layer provided between the hole injecting electrode and the electron injecting electrode, wherein the light emitting layer contains a rubrene derivative having a molecular structure represented by Formula (4):

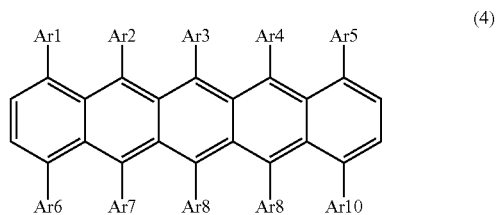

(4)

wherein Ar1-Ar10 are the same or different and each represent a hydrogen atom or a substituent.

Because the light emitting layer contains a rubrene derivative having a molecular structure represented by Formula (4), the organic electroluminescent device of the invention provides high luminance and high luminous efficiency.

The rubrene derivative may be 5,6,11,12-tetrakis(naphth-2-yl)-naphthacene having a molecular structure represented by Formula (A1):

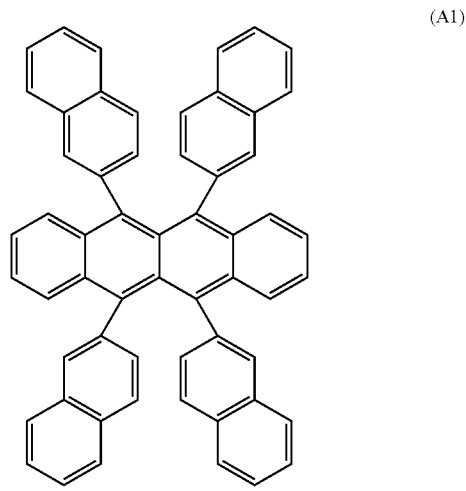

(A1)

This enables higher luminance and higher luminous efficiency than when the light emitting layer contains rubrene.

The rubrene derivative may be 5,12-bis(4-(6-methylbenzothiazole-2-yl)phenyl)-6,11-diphenylnaphthacene represented by Formula (A2):

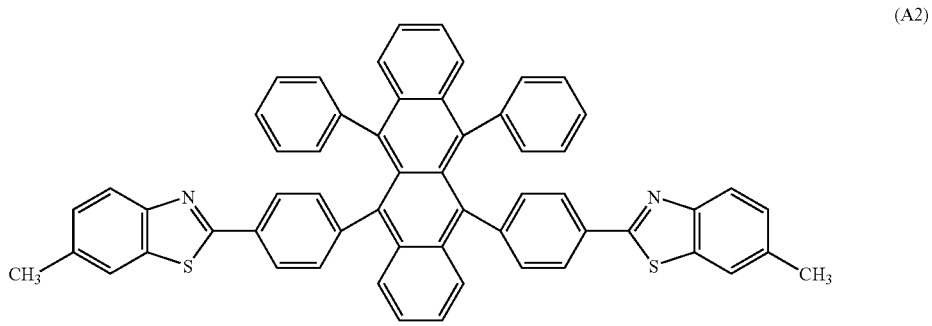

(A2)

This enables higher luminance and higher luminous efficiency than when the light emitting layer contains rubrene.

The rubrene derivative may be 5,6,11,12-tetrakis(4-tert-butylphenyl)-naphthacene represented by Formula (A3):

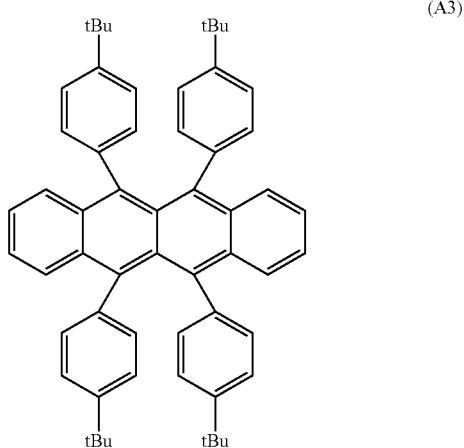

(A3)

This enables higher luminance and higher luminous efficiency than when the light emitting layer contains rubrene.

The rubrene derivative may be 5,12-bis(4-tert-butylphenyl)-naphthacene represented by Formula (A4):

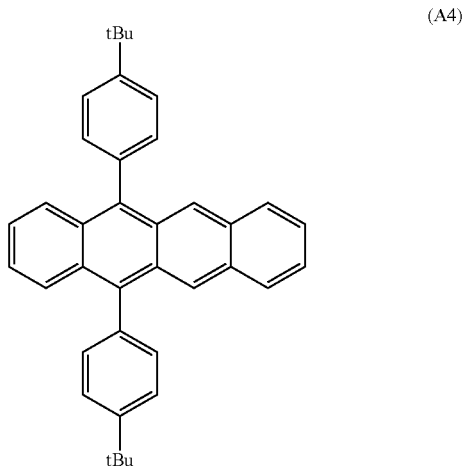

(A4)

This enables higher luminance and higher luminous efficiency than when the light emitting layer contains rubrene.

The rubrene derivative may be 5,12-diphenylnaphthacene represented by Formula (A5):

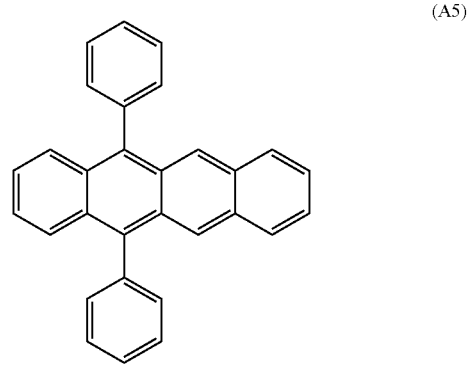

(A5)

This enables higher luminance and higher luminous efficiency than when the light emitting layer contains rubrene.

The rubrene derivative may be 5,12-bis(naphth-2-yl)-naphthacene represented by Formula (A6):

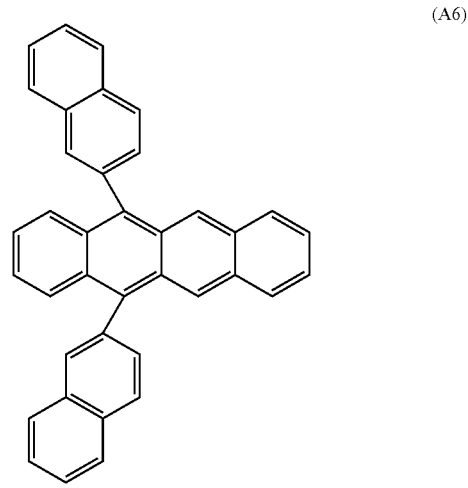

(A6)

This enables higher luminance and higher luminous efficiency than when the light emitting layer contains rubrene.

The rubrene derivative may be 5,12-bis(pyrene-1-yl)-naphthacene represented by Formula (A7):

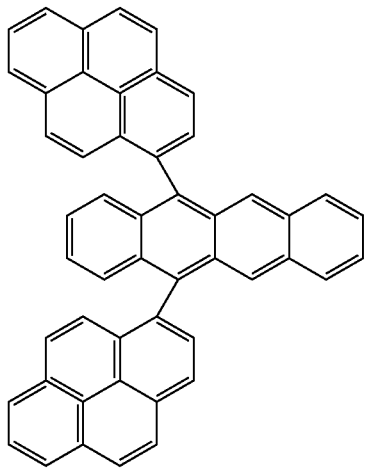

(A7)

This enables higher luminance and higher luminous efficiency than when the light emitting layer contains rubrene.

The rubrene derivative may be 5,6,13,14-6-tetrakisphenyl-pentacene represented by Formula (A8):

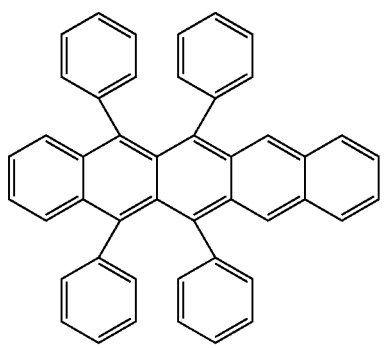

(A8)

This enables higher luminance and higher luminous efficiency than when the light emitting layer contains rubrene.

The rubrene derivative may be 6,13-bis(4-(6-methylbenzothiazole-2-yl)phenyl)-pentacene represented by Formula (A9):

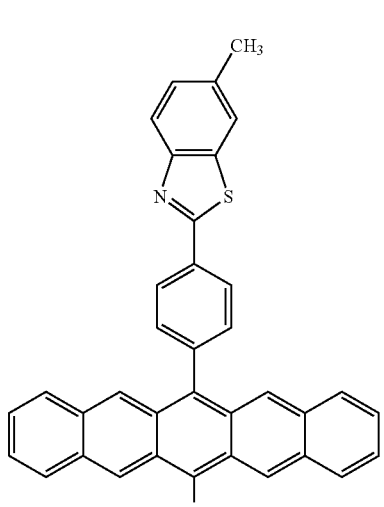

(A9)

-continued

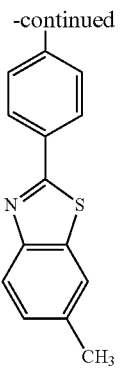

This enables higher luminance and higher luminous efficiency than when the light emitting layer contains rubrene.

The rubrene derivative may be 5,6,11,12-tetrakisphenyl-1,2-benzo-(3,4-benzo-)naphthacene represented by Formula (A10):

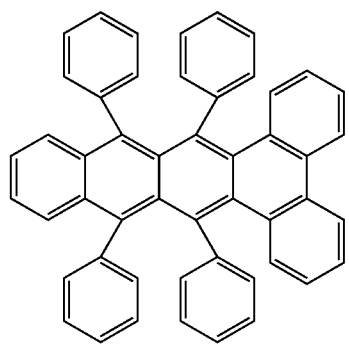

(A10)

This enables higher luminance and higher luminous efficiency than when the light emitting layer contains rubrene.

The light emitting layer may contain a host material, a light emitting dopant, and a first light-emission assisting dopant, with the first light-emission assisting dopant being composed of a rubrene derivative. The first light-emission assisting dopant serves to transfer excitation energy to the light emitting dopant. Using any of the rubrene derivatives shown above as the first light-emission assisting dopant enhances the luminance and luminous efficiency.

The light emitting layer may further contain a second light-emission assisting dopant. The second light-emission assisting dopant serves to adjust the balance of carriers flowing in the light emitting layer. Using the second light-emission assisting dopant further enhances the luminance and luminous efficiency.

The light emitting layer may contain a host material and a light emitting dopant, with the light emitting dopant being composed of a rubrene derivative. Using any of the rubrene derivatives shown above as the light emitting dopant enhances the luminance and luminous efficiency.

The content of the light emitting dopant may be not less than 0.1 percent by weight nor more than 50 percent by weight, with respect to the host material. This causes the light emitting dopant to act not as a host but as a dopant.

In an organic electroluminescent device having a light emitting layer between a hole injecting electrode and an electron injecting electrode, the light emitting layer may include a first light emitting layer that contains a compound having a molecular structure represented by Formula (C1) and a second light emitting layer that contains a luminescent material that emits blue light.

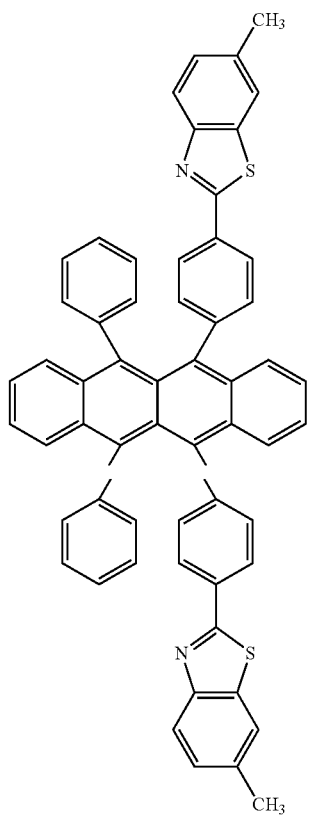

(C1)

In an organic electroluminescent device having a light emitting layer between a hole injecting electrode and an electron injecting electrode, the light emitting layer may include a first light emitting layer that contains a compound having a molecular structure represented by Formula (C2) and a second light emitting layer that contains a luminescent material that emits blue light.

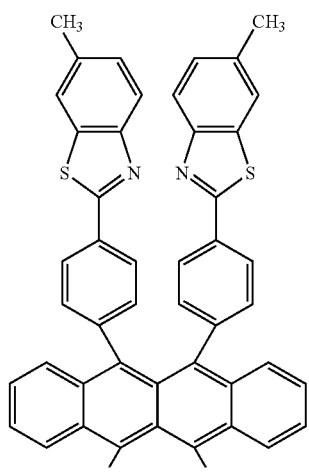

(C2)

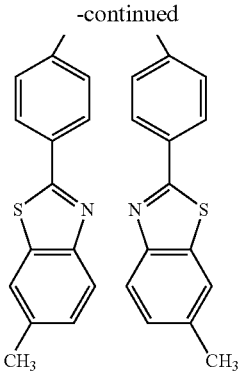

-continued

In an organic electroluminescent device having a light emitting layer between a hole injecting electrode and an electron injecting electrode, the light emitting layer may include a first light emitting layer that contains a compound having a molecular structure represented by Formula (C3) and a second light emitting layer that contains a luminescent material that emits blue light.

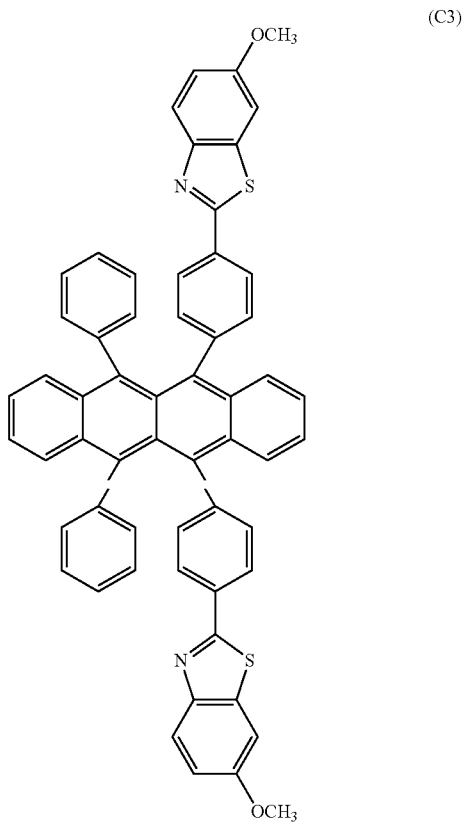

(C3)

In an organic electroluminescent device having a light emitting layer between a hole injecting electrode and an electron injecting electrode, the light emitting layer may include a first light emitting layer that contains a compound having a molecular structure represented by Formula (C4) and a second light emitting layer that contains a luminescent material that emits blue light.

(C4)

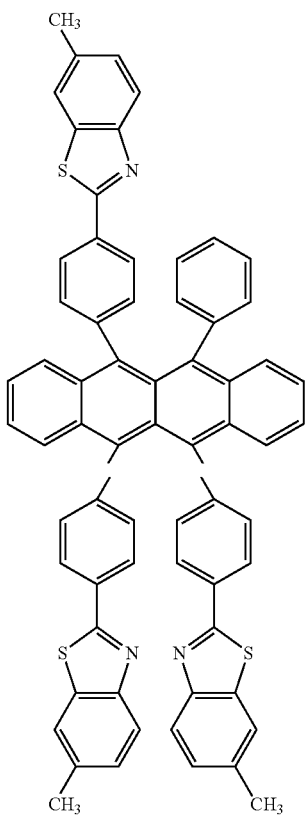

In an organic electroluminescent device having a light emitting layer between a hole injecting electrode and an electron injecting electrode, the light emitting layer may include a first light emitting layer that contains a compound having a molecular structure represented by Formula (C5) and a second light emitting layer that contains a luminescent material that emits blue light.

(C5)

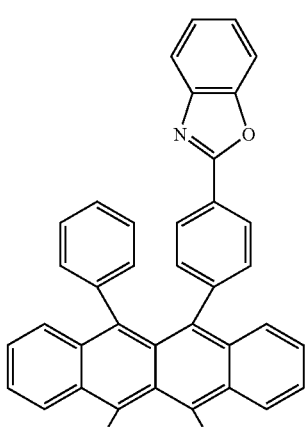

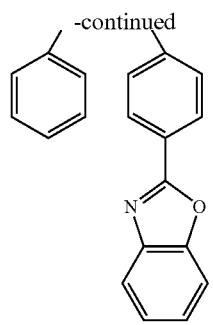

In an organic electroluminescent device having a light emitting layer between a hole injecting electrode and an electron injecting electrode, the light emitting layer may include a first light emitting layer that contains a compound having a molecular structure represented by Formula (C6) and a second light emitting layer that contains a luminescent material that emits blue light.

(C6)

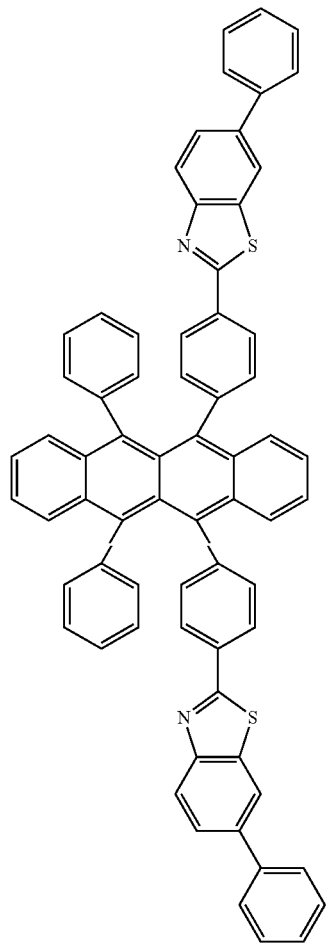

In an organic electroluminescent device having a light emitting layer between a hole injecting electrode and an electron injecting electrode, the light emitting layer may include a first light emitting layer that contains a compound having a molecular structure represented by Formula (C7) and a second light emitting layer that contains a luminescent material that emits blue light.

(C7)

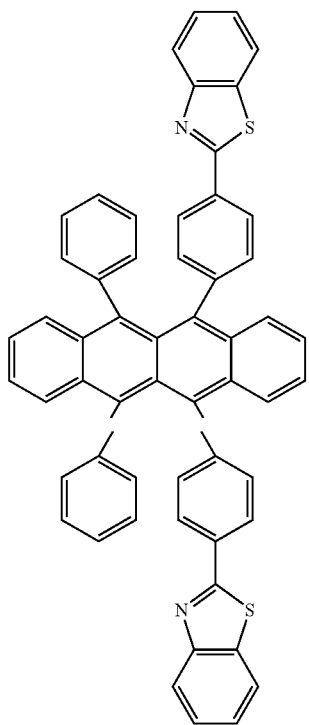

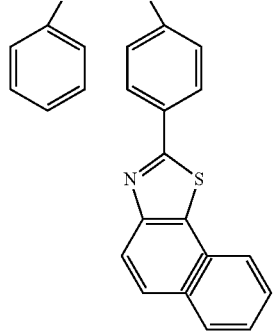

In an organic electroluminescent device having a light emitting layer between a hole injecting electrode and an electron injecting electrode, the light emitting layer may include a first light emitting layer that contains a compound having a molecular structure represented by Formula (C9) and a second light emitting layer that contains a luminescent material that emits blue light.

In an organic electroluminescent device having a light emitting layer between a hole injecting electrode and an electron injecting electrode, the light emitting layer may include a first light emitting layer that contains a compound having a molecular structure represented by Formula (C8) and a second light emitting layer that contains a luminescent material that emits blue light.

(C8)

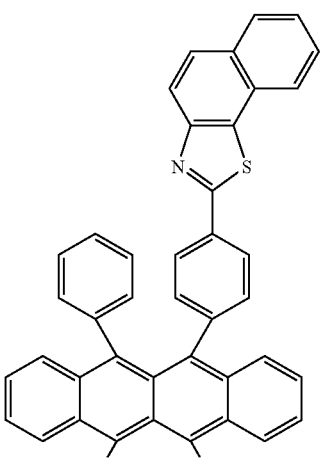

(C9)

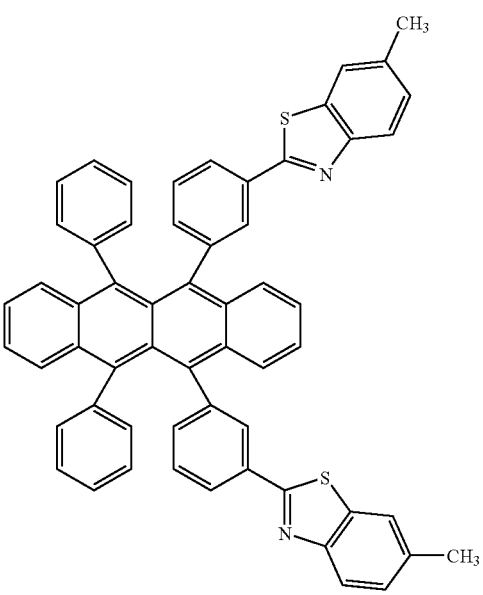

In an organic electroluminescent device having a light emitting layer between a hole injecting electrode and an electron injecting electrode, the light emitting layer may include a first light emitting layer that contains a compound having a molecular structure represented by Formula (C10) and a second light emitting layer that contains a luminescent material that emits blue light.

(C10)

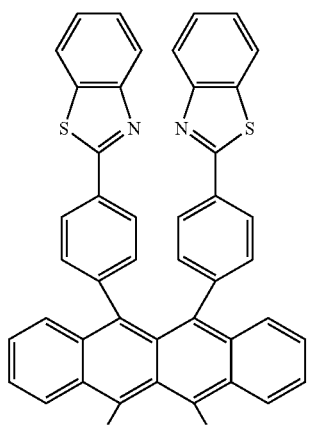

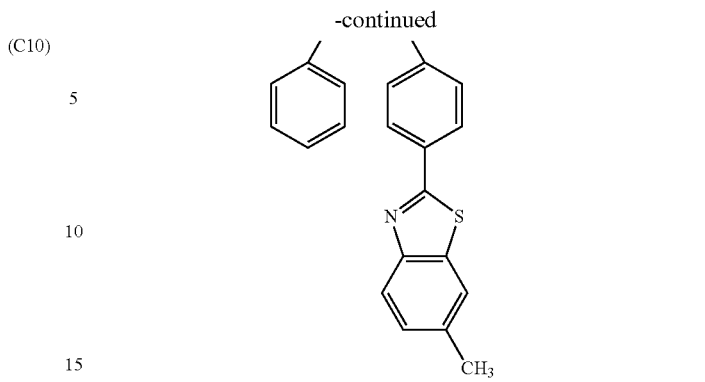

In an organic electroluminescent device having a light emitting layer between a hole injecting electrode and an electron injecting electrode, the light emitting layer may include a first light emitting layer that contains a compound having a molecular structure represented by Formula (C11) and a second light emitting layer that contains a luminescent material that emits blue light.

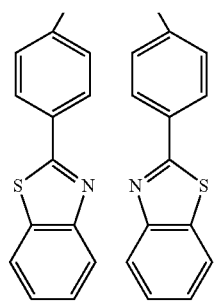

In an organic electroluminescent device having a light emitting layer between a hole injecting electrode and an electron injecting electrode, the light emitting layer may include a first light emitting layer that contains a compound having a molecular structure represented by Formula (C12) and a second light emitting layer that contains a luminescent material that emits blue light.

(C12)

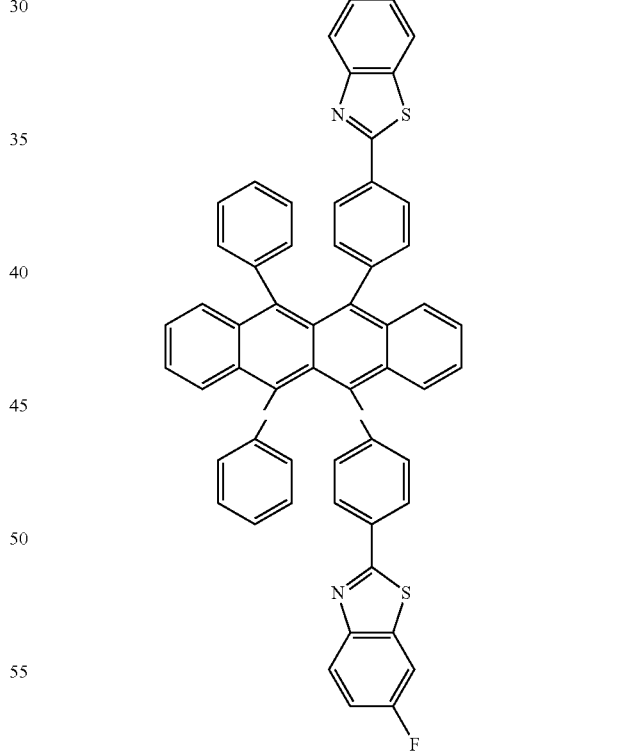

(C11)

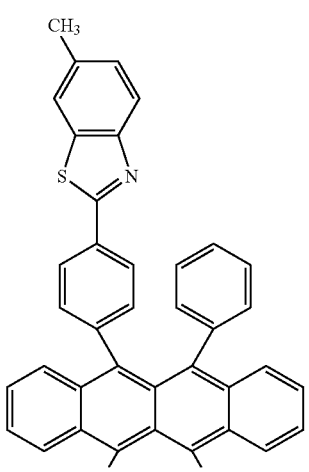

In an organic electroluminescent device having a light emitting layer between a hole injecting electrode and an electron injecting electrode, the light emitting layer may include a first light emitting layer that contains a compound having a molecular structure represented by Formula (C13) and a second light emitting layer that contains a luminescent material that emits blue light.

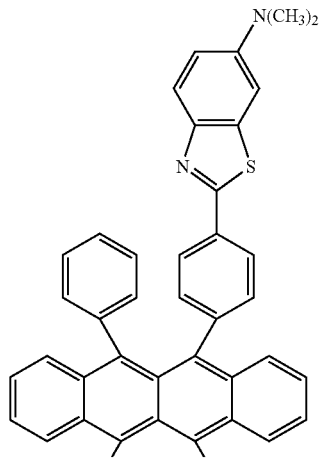
(C13)

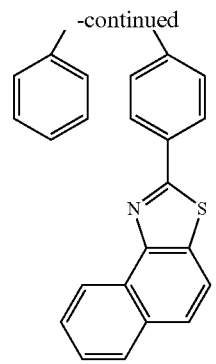

In an organic electroluminescent device having a light emitting layer between a hole injecting electrode and an electron injecting electrode, the light emitting layer may include a first light emitting layer that contains a compound having a molecular structure represented by Formula (C15) and a second light emitting layer that contains a luminescent material that emits blue light.

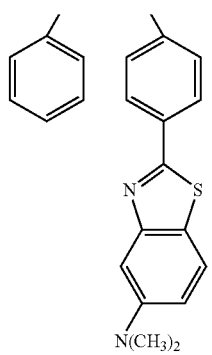

In an organic electroluminescent device having a light emitting layer between a hole injecting electrode and an electron injecting electrode, the light emitting layer may include a first light emitting layer that contains a compound having a molecular structure represented by Formula (C14) and a second light emitting layer that contains a luminescent material that emits blue light.

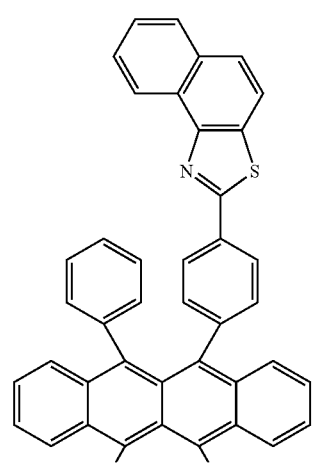
(C14)

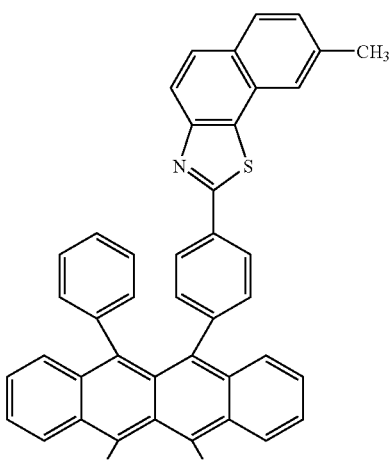
(C15)

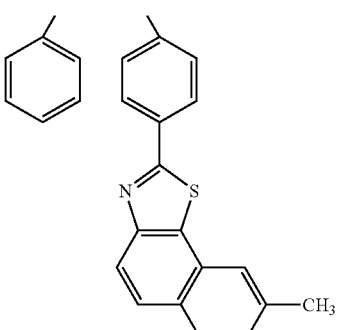

In an organic electroluminescent device having a light emitting layer between a hole injecting electrode and an electron injecting electrode, the light emitting layer may include a first light emitting layer that contains a compound having a molecular structure represented by Formula (C16) and a second light emitting layer that contains a luminescent material that emits blue light.

(C16)

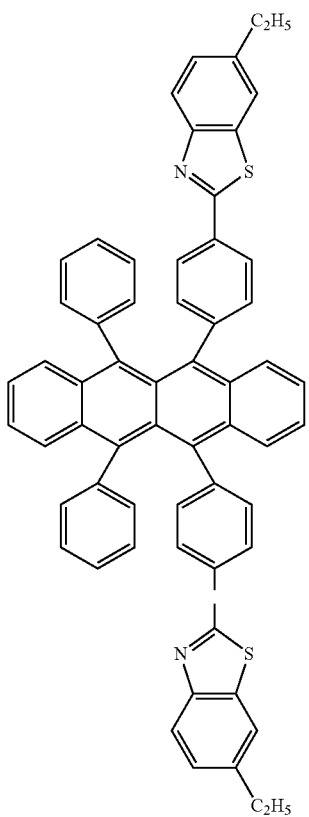

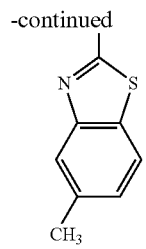

In an organic electroluminescent device having a light emitting layer between a hole injecting electrode and an electron injecting electrode, the light emitting layer may include a first light emitting layer that contains a compound having a molecular structure represented by Formula (C18) and a second light emitting layer that contains a luminescent material that emits blue light.

In an organic electroluminescent device having a light emitting layer between a hole injecting electrode and an electron injecting electrode, the light emitting layer may include a first light emitting layer that contains a compound having a molecular structure represented by Formula (C17) and a second light emitting layer that contains a luminescent material that emits blue light.

(C17)

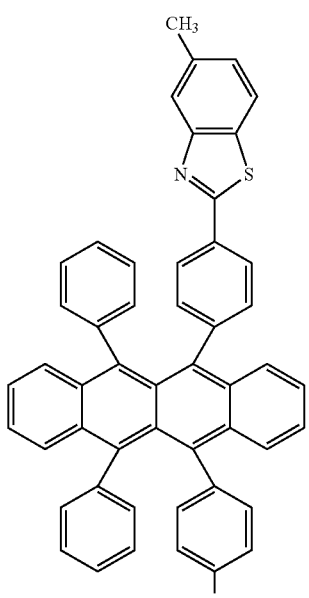

(C18)

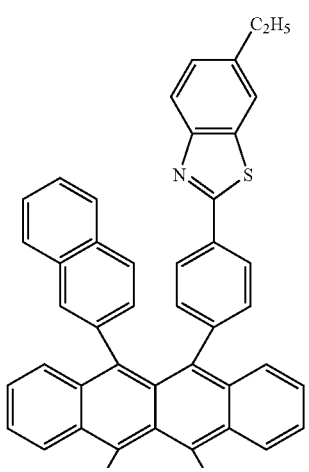

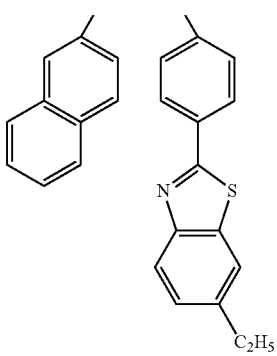

In an organic electroluminescent device having a light emitting layer between a hole injecting electrode and an electron injecting electrode, the light emitting layer may include a first light emitting layer that contains a compound having a molecular structure represented by Formula (C19) and a second light emitting layer that contains a luminescent material that emits blue light.

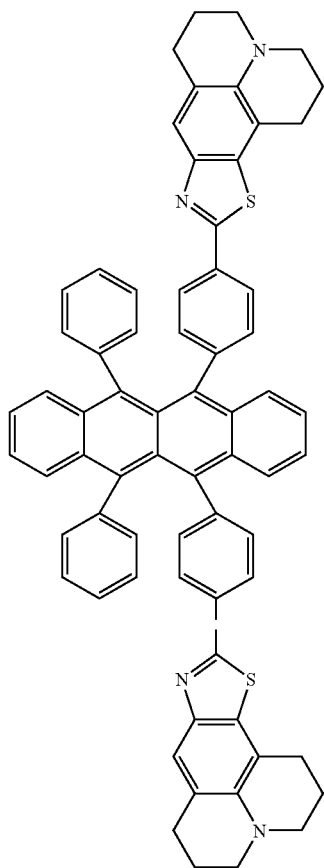

(C19)

In an organic electroluminescent device having a light emitting layer between a hole injecting electrode and an electron injecting electrode, the light emitting layer may include a first light emitting layer that contains a compound having a molecular structure represented by Formula (C20) and a second light emitting layer that contains a luminescent material that emits blue light.

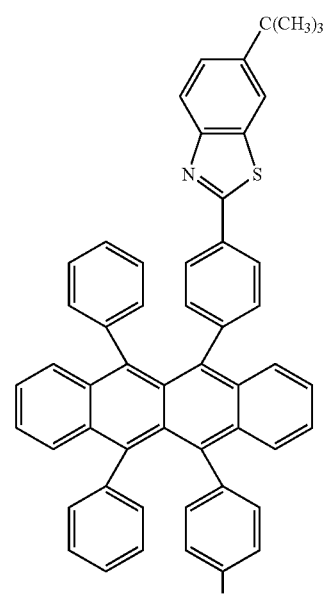

(C20)

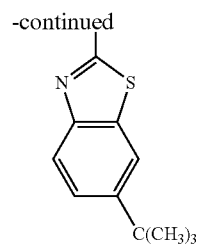

-continued

The luminescent materials having the molecular structures represented by Formulas (C1)-(C20) are capable of emitting orange or yellow light with high luminance and high luminous efficiency, and so the first light emitting layer emits orange or yellow light and the second light emitting layer emits blue light. Then, because of the complementary relation between orange or yellow and blue, the organic electroluminescent device is capable of emitting white light.

Preferably, the second light emitting layer contains an anthracene derivative as a host material and a perylene derivative as a light emitting dopant. This allows the second light emitting layer to efficiently emit blue light.

In an organic electroluminescent device having a light emitting layer provided between a hole injecting electrode and an electron injecting electrode, the light emitting layer may include a first light emitting layer that contains at least one compound selected from the group consisting of compounds having molecular structures represented by Formulas (C1)-(C20) and at least one compound selected from the group consisting of compounds represented by Formulas (A4)-(A7), (A10), and (C21)-(C27), and a second light emitting layer that contains a luminescent material that emits blue light.

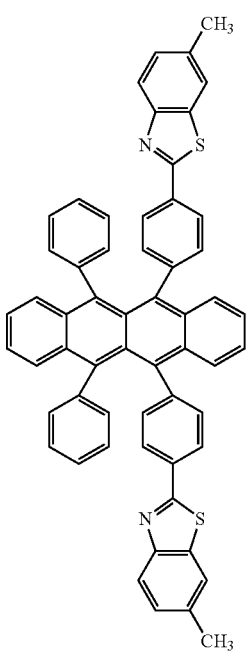

(C1)

-continued
(C2)
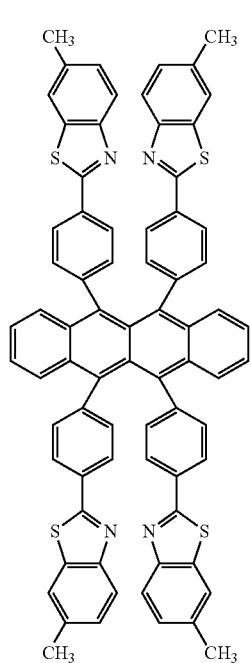
(C4)
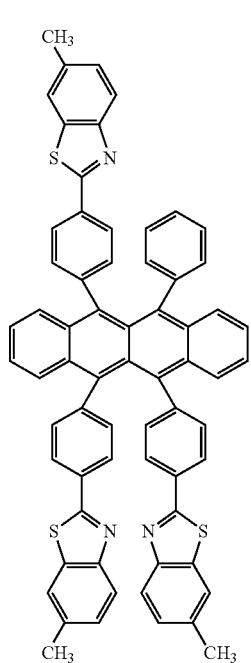
(C3)
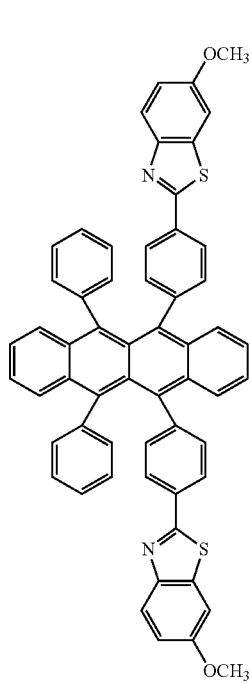
(C5)
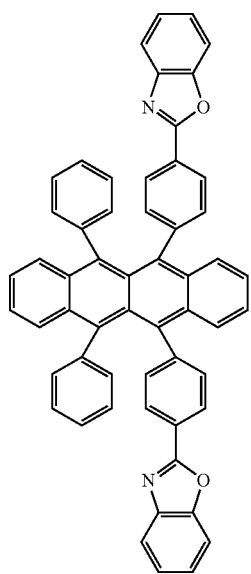

-continued
(C6)
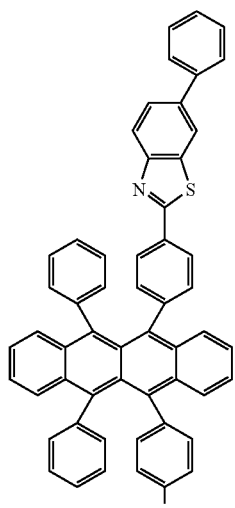
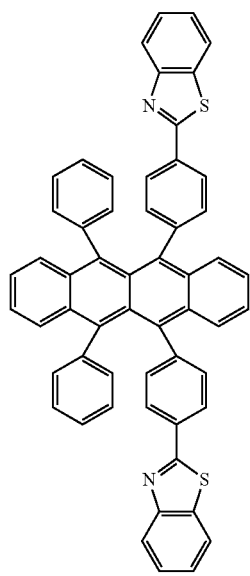
(C7)
(C8)
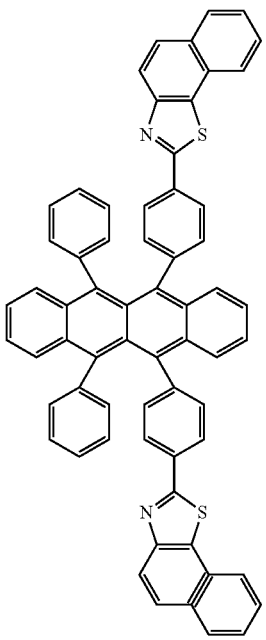
(C9)
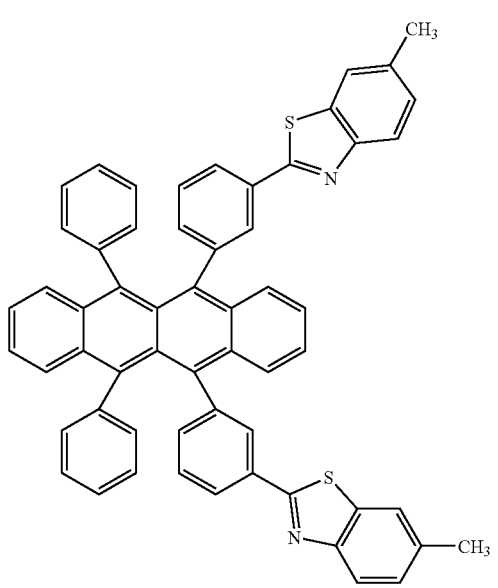

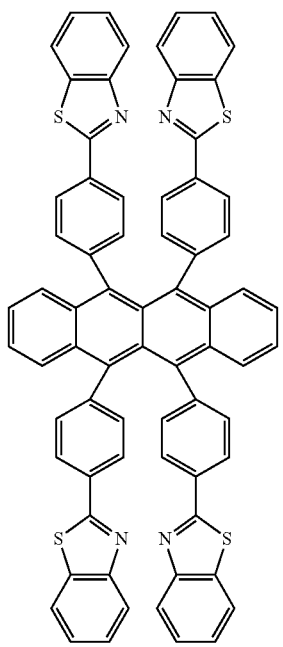
(C10)
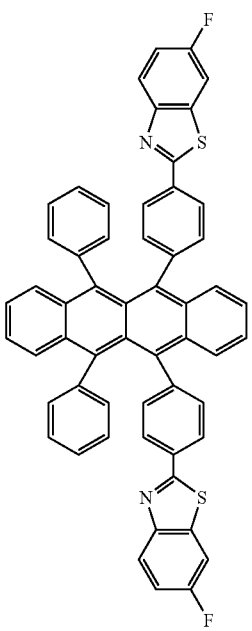
(C12)
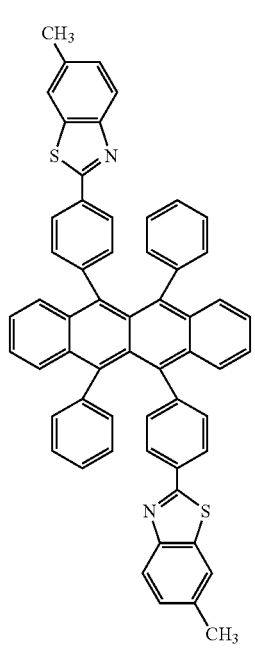
(C11)
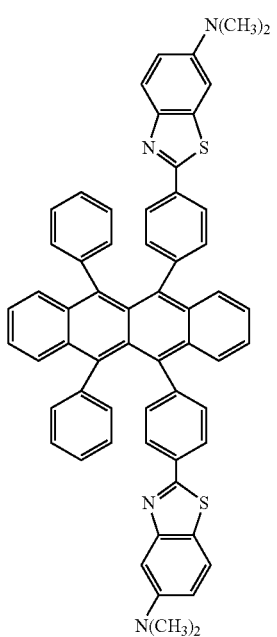
(C13)

-continued
(C14)
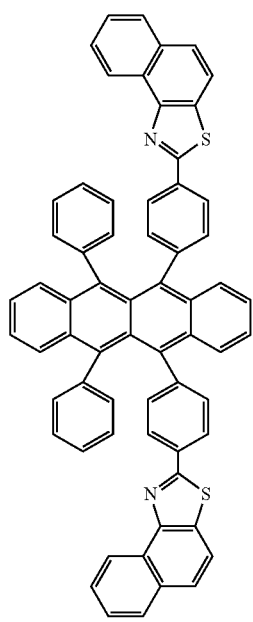
(C15)
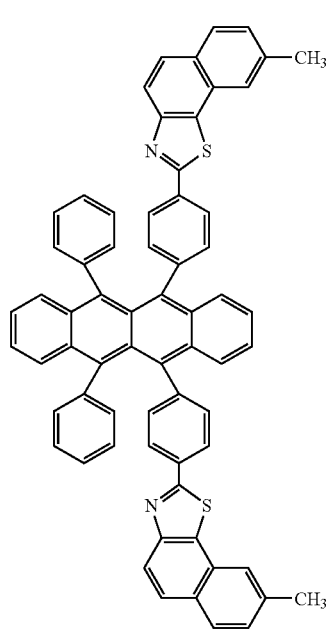
(C16)
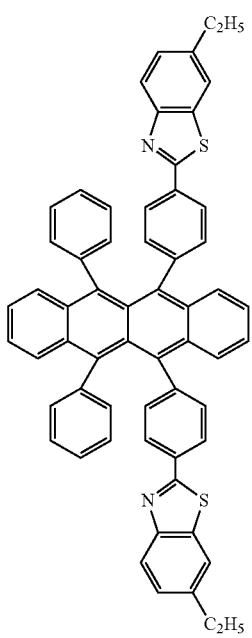
(C17)
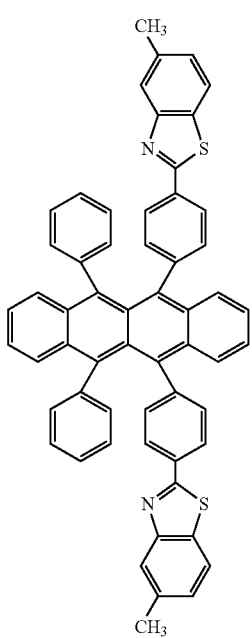

-continued
(C18)
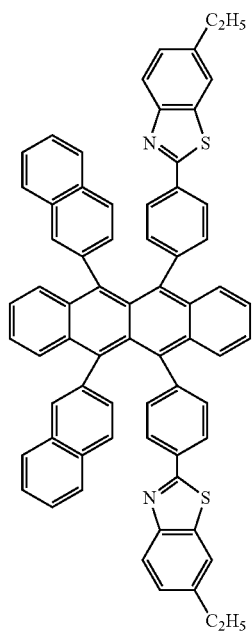
(C19)
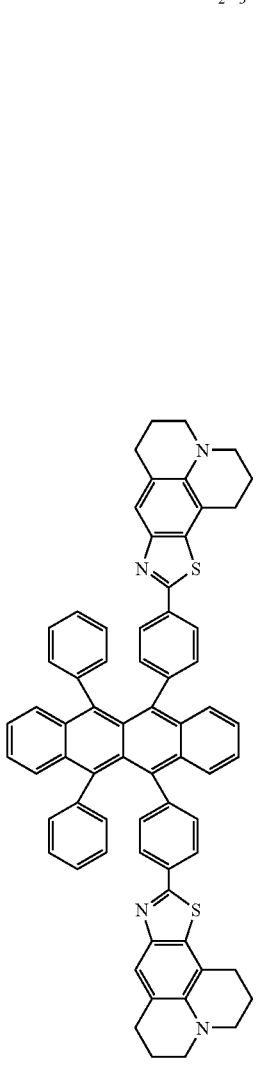
-continued
(C20)
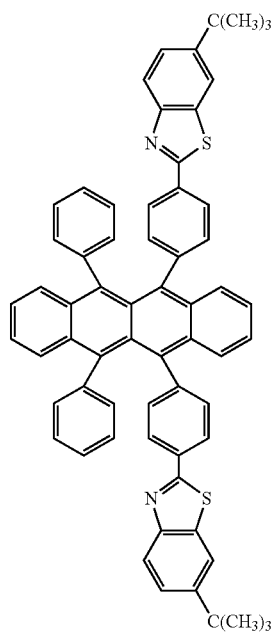
(A4)
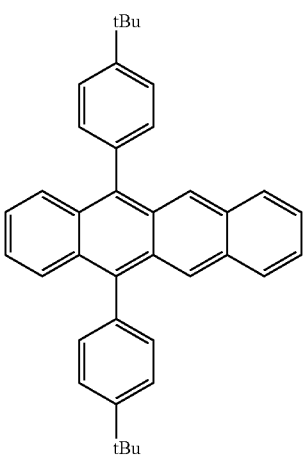
(A5)
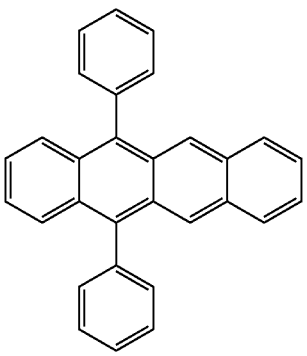

(A6)
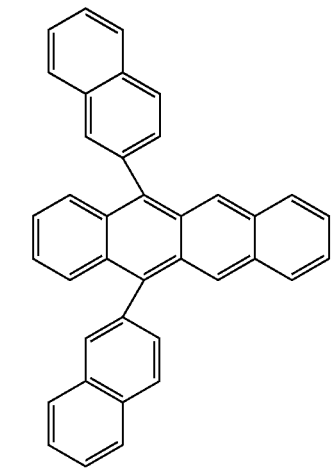
(A7)
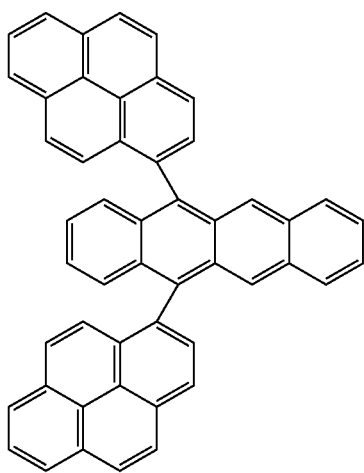
(A10)
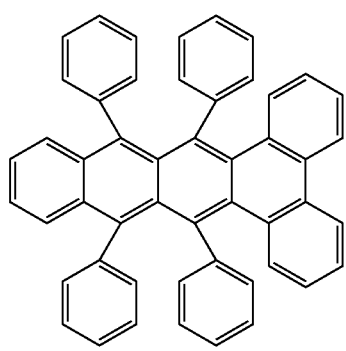
(C21)
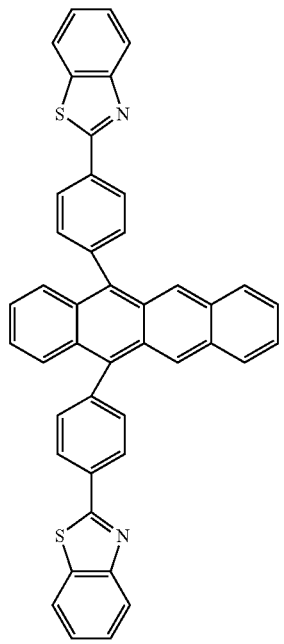
(C22)
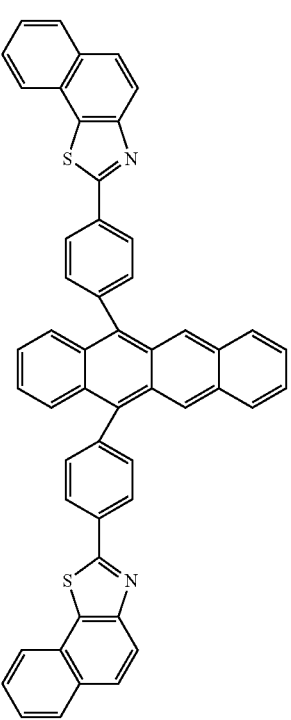

-continued
(C23)
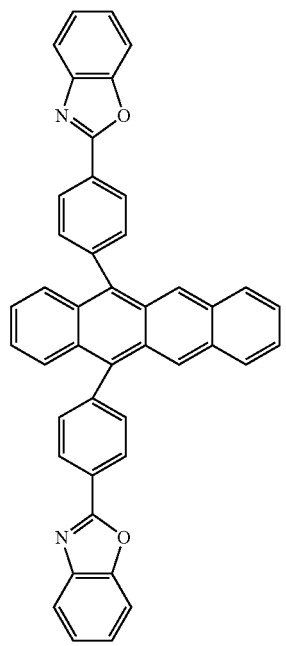
(C25)
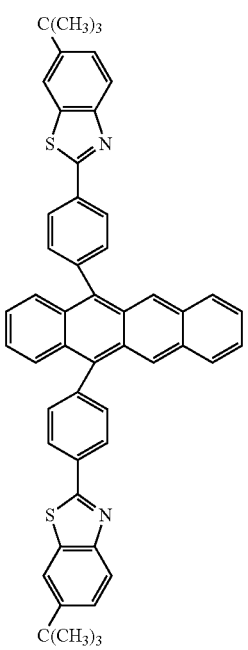
(C24)
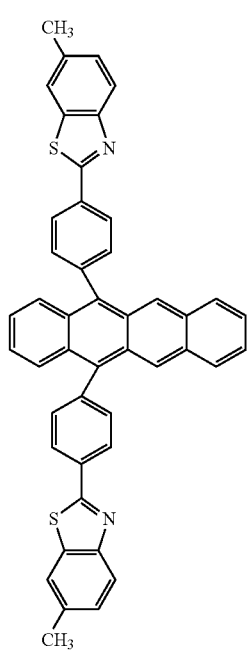
(C26)
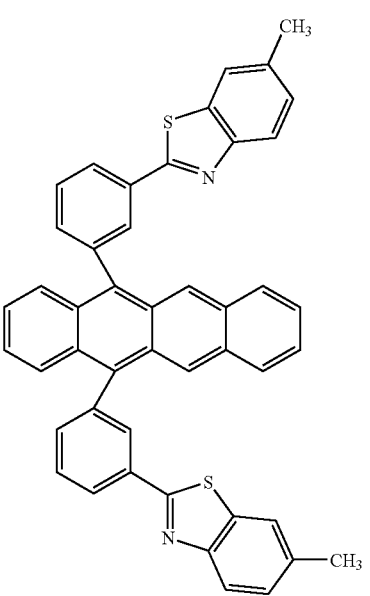

-continued

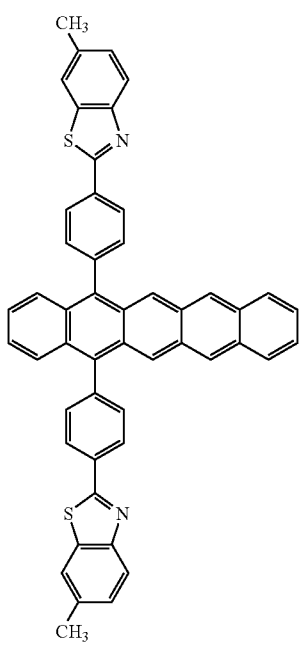

(C27)

The compounds having the molecular structures represented by Formulas (C1)-(C20) are capable of emitting orange light and the luminescent materials having the molecular structures represented by Formulas (A4)-(A7), (A10) and (C21)-(C27) are capable of emitting green light. Thus, when the first light emitting layer contains an orange-emitting luminescent material and a green-emitting luminescent material and the second light emitting layer contains a blue-emitting luminescent material, it is possible to obtain high luminous efficiency and white light emission with high color purity.

According to still another aspect of the invention, a luminescent material has a molecular structure represented by Formula (1):

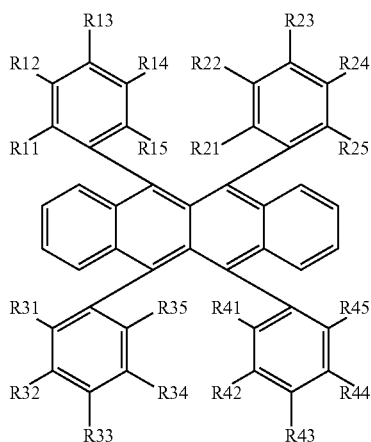

(1)

wherein R11-R15, R21-R25, R31-R35 and R41-R45 are the same or different and each represent a hydrogen atom or a substituent, where the structure in which all are hydrogen atoms is excluded. Adjacent two of R11-R15, adjacent two of R21-R25, adjacent two of R31-R35, and adjacent two of R41-R45 may be bonded together to form rings. Adjacent three of R11-R15, adjacent three of R21-R25, adjacent three of R31-R35, and adjacent three of R41-R45 may be bonded together to form rings.

According to a further aspect of the invention, a luminescent material has a molecular structure represented by Formula (2):

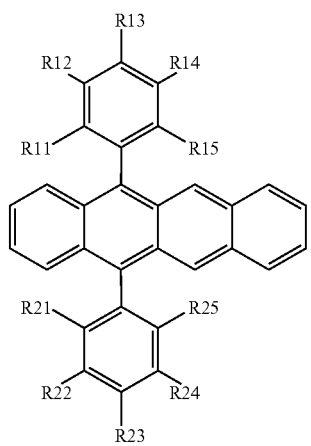

(2)

wherein R11-R15 and R21-R25 are the same or different and each represent a hydrogen atom or a substituent. Adjacent two of R11-R15 and adjacent two of R21-R25 may be bonded together to form rings. Adjacent three of R11-R15 and adjacent three of R21-R25 may be bonded together to form rings.

According to a further aspect of the invention, a luminescent material has a molecular structure represented by Formula (3):

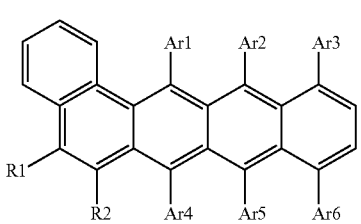

(3)

wherein Ar1-Ar6 are the same or different and each represent a hydrogen atom or a substituent. R1 and R2 are the same or different and each represent a hydrogen atom or a substituent. Adjacent R1 and R2 may be bonded together to form a ring.

According to a further aspect of the invention, a luminescent material has a molecular structure represented by Formula (4):

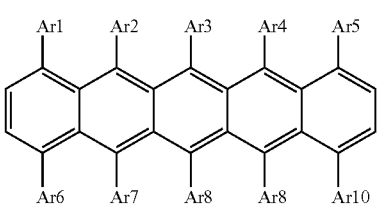

(4)

wherein Ar1-Ar10 are the same or different and each represent a hydrogen atom or a substituent.

BEST MODE FOR CARRYING OUT THE INVENTION

Figure 1:
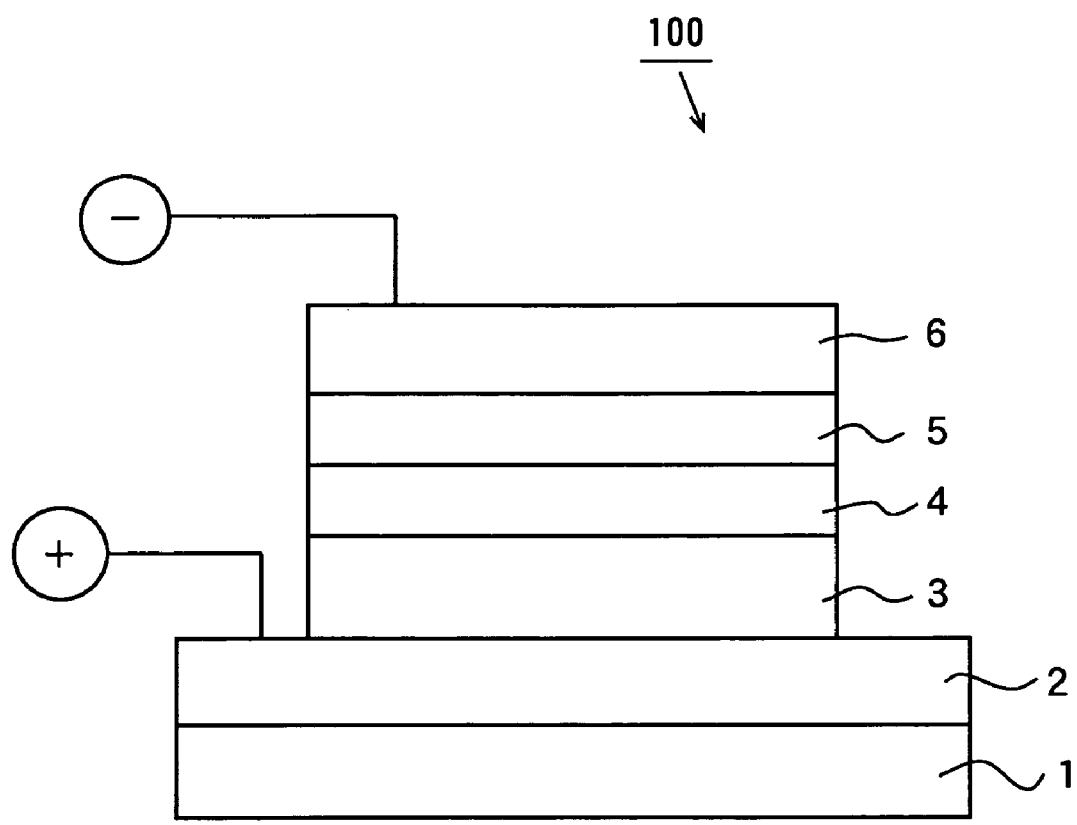
FIG. 1 is a schematic diagram showing the structure of an organic EL device according to an embodiment of the invention.

FIG. 1 is a schematic diagram showing the structure of an organic electroluminescent device (hereinafter referred to as an organic EL device) according to an embodiment of the invention.

As shown in FIG. 1, in the organic EL device 100, a hole injecting electrode (anode) 2, made of a transparent electrode film, resides on a glass substrate 1. On the hole injecting electrode 2, a hole injecting layer 3 made of an organic material, a hole transporting layer 4 of an organic material, and a light emitting layer 5 of an organic material are formed in sequence. An electron injecting electrode (cathode) 6 lies on the light emitting layer 5. In place of the hole transporting layer 4, an electron transporting layer may be provided between the light emitting layer 5 and the electron injecting electrode 6.

It is preferred that the light emitting layer 5 contain a rubrene derivative having a molecular structure represented by Formula (1) below, or a rubrene derivative having a molecular structure represented by Formula (2) below.

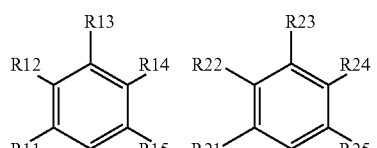

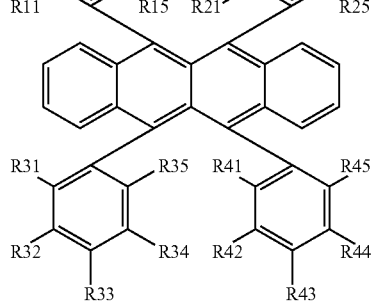

(1)

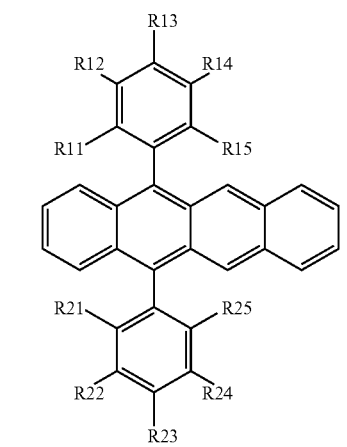

(2)

In Formulas (1) and (2), R11-R15, R21-R25, R31-R35 and R41-R45 are the same or different and each represent a hydrogen atom or a substituent, excepting for structures in which all are hydrogen atoms. Adjacent two of R11-R15, adjacent two of R21-R25, adjacent two of R31-R35, and adjacent two of R41-R45 may be bonded together to form rings. Adjacent three of R11-R15, adjacent three of R21-R25, adjacent three of R31-R35, and adjacent three of R41-R45 may be bonded together to form rings.

In Formula (2), R11-R15 and R21-R25 are the same or different and each represent a hydrogen atom or a substituent. Adjacent two of R11-R15 and adjacent two of R21-R25 may be bonded together to form rings. Adjacent three of R11-R15 and adjacent three of R21-R25 may be bonded together to form rings.

For example, in Formulas (1) and (2), R11-R15, R21-R25, R31-R35 and R41-R45 are —H, —$C_nH_{2n+1}$ (n=1-10), —$OC_nH_{2n+1}$ (n=1-10), —$N(C_nH_{2n+1})_2$ (n=1-10), —X (X=F, Cl, Br, or I), —CN, or substituents represented by Formula (a1) below.

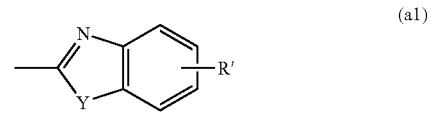

(a1)

Note that the structure in which R11-R15, R21-R25, R31-R35, R41-R45 in Formula (1) are all —H is excluded. In Formula (a1), Y is O or S, for example, and R' is —H, —$C_nH_{2n+1}$ (n=1-10), —$OC_nH_{2n+1}$ (n=1-10), —$N(C_nH_{2n+1})_2$ (n=1-10), —X (X=F, Cl, Br, or I), —CN, or a phenyl group, for example.

In Formulas (1) and (2), adjacent two of R11-R15, adjacent two of R21-R25, adjacent two of R31-R35, and adjacent two of R41-R45 may be bonded together to form any of the ring structures represented by Formula (a2) below.

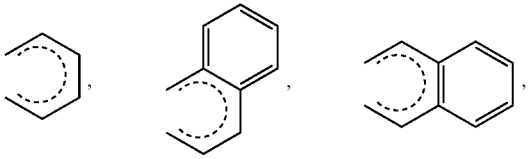

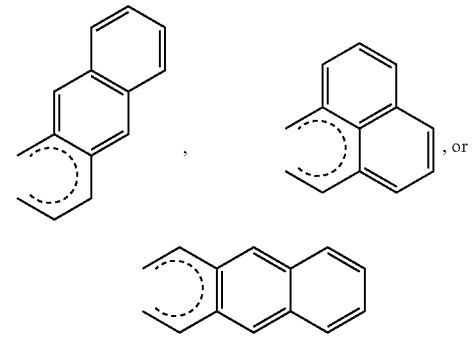

(a2)

In Formulas (1) and (2), adjacent three of R11-R15, adjacent three of R21-R25, adjacent three of R31-R35, and adjacent three of R41-R45 may be bonded together to form the ring structure represented by Formula (a3) below.

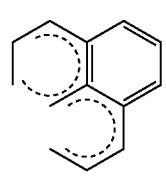

(a3)

Alternatively, the light emitting layer 5 preferably contains a rubrene derivative having a molecular structure represented by Formula (3) below, or a rubrene derivative having a molecular structure represented by Formula (4) below.

(3)

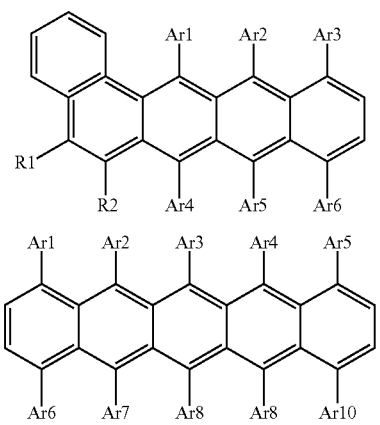

(4)

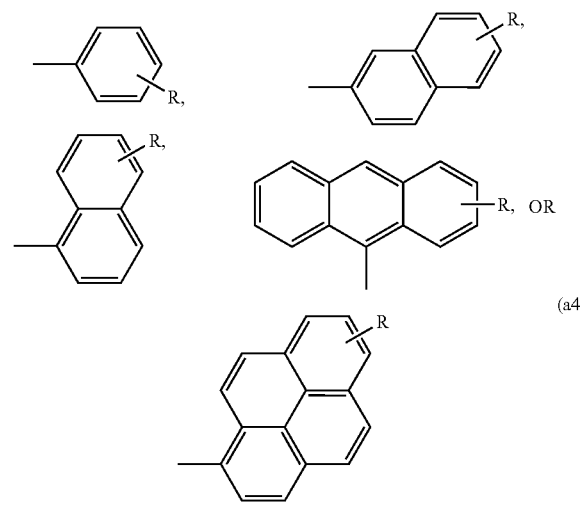

In Formulas (3) and (4), Ar1-Ar10 are the same or different and each represent a hydrogen atom or a substituent. In Formula (3), R1 and R2 are the same or different and each represent a hydrogen atom or a substituent. In Formula (3), adjacent R1 and R2 may be bonded together to form a ring.

For example, in Formula (3), Ar1-Ar6 are —H, —$C_nH_{2n+1}$ (n=1-10), —$OC_nH_{2n+1}$ (n=1-10), —$N(C_nH_{2n+1})_2$ (n=1-10), —X (X=F, Cl, Br, or I), —CN, or any of substituents represented by Formula (a4).

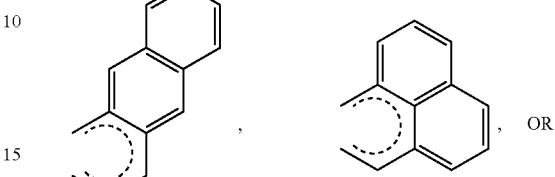

(a4)

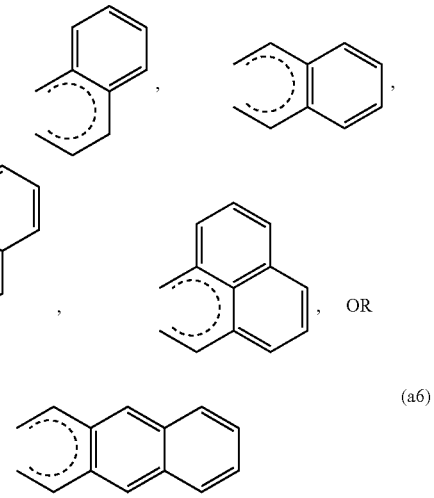

In Formula (a4), R is, for example, —H, —$C_nH_{2n+1}$ (n=1-10), —$OC_nH_{2n+1}$ (n=1-10), —$N(C_nH_{2n+1})_2$ (n=1-10), —X (X=F, Cl, Br, or I), —CN, a phenyl group, or a substituent represented by Formula (a5).

(a5)

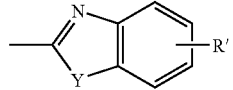

In Formula (a5), Y is O or S, for example, and R' is —H, —$C_nH_{2n+1}$ (n=1-10), —$OC_nH_{2n+1}$ (n=1-10), —$N(C_nH_{2n+1})_2$ (n=1-10), —X (X=F, Cl, Br, or I), —CN, or a phenyl group, for example.

In Formula (3), adjacent R1 and R2 may be bonded together to form any of the ring structures represented by Formula (a6) below.

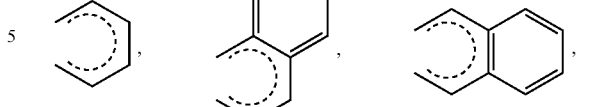

(a6)

In a first example, the light emitting layer 5 contains a host material, a light emitting dopant, and a first light-emission assisting dopant, where the first light-emission assisting dopant is composed of any of the rubrene derivatives shown above. The first light-emission assisting dopant serves to transfer excitation energy to the light emitting dopant. Using the rubrene derivatives shown above as the first light-emission assisting dopant enhances the luminance and luminous efficiency.

In a second example, the light emitting layer 5 contains a host material, a light emitting dopant, a first light-emission assisting dopant, and a second light-emission assisting dopant, where the first light-emission assisting dopant is composed of any of the rubrene derivatives shown above. The second light-emission assisting dopant serves to adjust the balance of carriers that flow in the light emitting layer. Further adding the second light-emission assisting dopant enhances the luminance and luminous efficiency.

The first and second light-emission assisting dopants do not emit light themselves.

In a third example, the light emitting layer 5 contains a host material and a light emitting dopant, where the light emitting dopant is composed of any of the rubrene derivatives shown above. Using the rubrene derivatives shown above as the light emitting dopant enhances the luminance and luminous efficiency.

In the cases above, the content of the light emitting dopant is from 0.1 to 50 percent by weight, preferably from 1 to 10 percent by weight, with respect to the host material.

In the organic EL device 100, a voltage is applied between the hole injecting electrode 2 and the electron injecting electrode 6 to cause the light emitting layer 5 in the organic EL device 100 to emit light, which is emitted from the back of the glass substrate 1.

Compounds represented by Formulas (1) to (4) can be prepared by conventional methods. For example, they can be obtained by coupling reactions, in the presence of transition metal compounds (e.g. palladium compounds), between condensed polycyclic hydrocarbons (e.g. naphthacene, pentacene, benz[a]naphthacene, dibenz[a,c]naphthacene, etc.) that have leaving groups (e.g. halogen atoms) at certain positions and that have adjacent benzene rings ortho-condensed, and compounds corresponding to substituents of the condensed polycyclic hydrocarbons (benzene compounds having R11-

R45, compounds corresponding to Ar1-Ar10). Further, the reactions may be caused in a presence of bases (e.g. sodium hydroxide). The reactions can usually be carried out using an inert solvent in an inert gas atmosphere at about 30 to 120° C.

Figure 2:
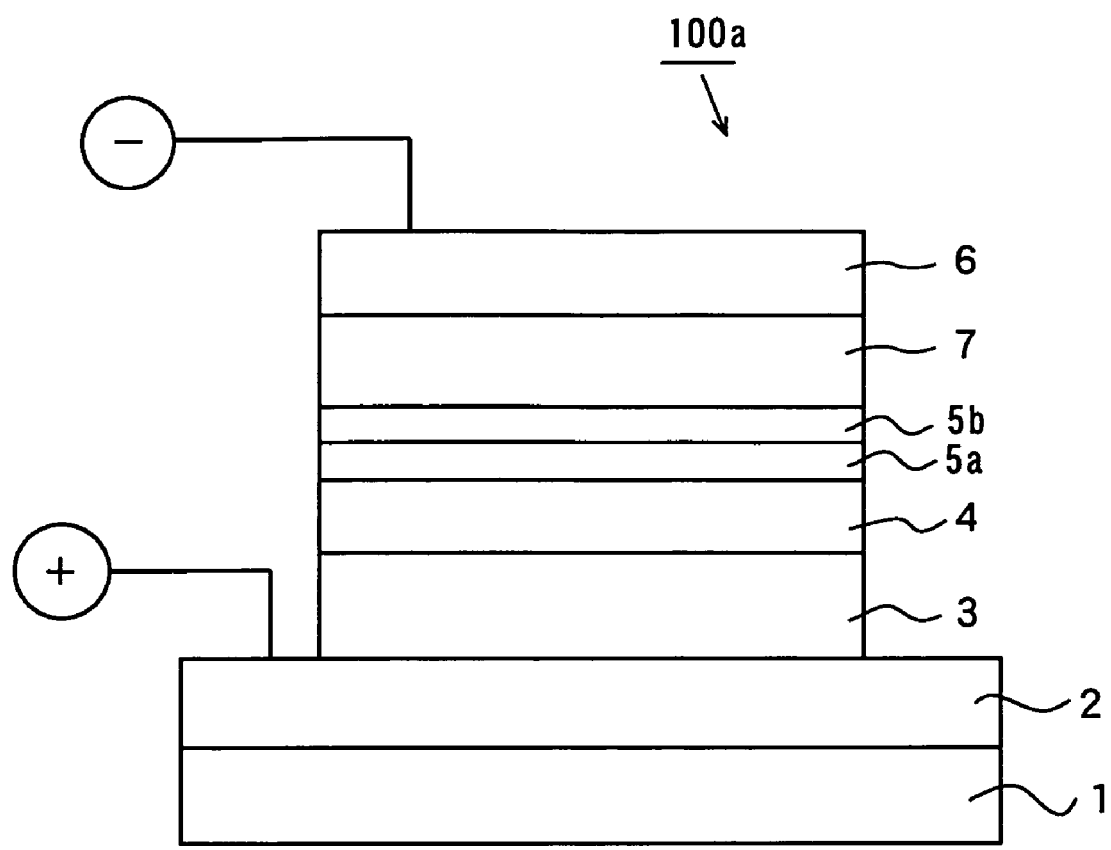
FIG. 2 is a schematic diagram showing the structure of an organic EL device according to another embodiment of the invention.

FIG. 2 is a schematic diagram showing the structure of an organic EL device according to another embodiment of the invention.

As shown in FIG. 2, in the organic EL device 100a, a hole injecting electrode (anode) 2, made of a transparent electrode film, resides on a glass substrate 1. On the hole injecting electrode 2, a hole injecting layer 3 made of an organic material, a hole transporting layer 4 of an organic material, a first light emitting layer 5a of an organic material, a second light emitting layer 5b, and an electron transporting layer 7 are formed in sequence. An electron injecting electrode (cathode) 6 lies on the electron transporting layer 7.

The first light emitting layer 5a contains a rubrene derivative that emits orange or yellow light, among rubrene derivatives having molecular structures represented by Formula (1) shown above, rubrene derivatives having molecular structures represented by Formula (2) above, rubrene derivatives having molecular structures represented by Formula (3) above, or among rubrene derivatives having molecular structures represented by Formula (4) above.

The second light emitting layer 5b contains a luminescent material that emits blue light. For example, the second light emitting layer 5b contains an anthracene derivative as a host material and contains a perylene derivative as a light emitting dopant.

For example, dianthranylanthracene having the molecular structure of Formula (B1) can be used as an anthracene derivative.

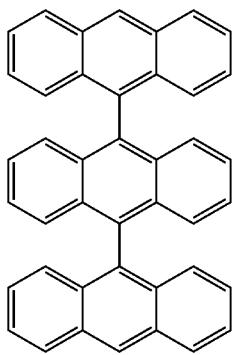

(B1)

Also, as an anthracene derivative, diphenylanthracene having the molecular structure of Formula (B2) may be used.

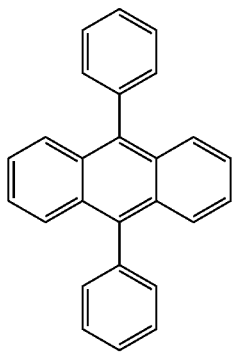

(B2)

As for a perylene derivative, perylene having the molecular structure of Formula (B3) can be used.

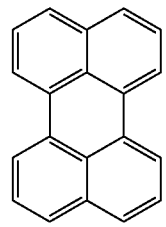

(B3)

In the organic EL device 100a of this embodiment, the first light emitting layer 5a emits orange or yellow light and the second light emitting layer 5b emits blue light. Thus, the organic EL device 100a can emit white light, because of complementary relation between orange or yellow and blue.

The first light emitting layer 5a may be doped with light emitting dopants of two kinds: an orange-emitting rubrene derivative (for example, any of the rubrene derivatives represented by Formulas (C1) to (C20) shown later) and a green-emitting rubrene derivative (for example, any of the rubrene derivatives represented by Formulas (A4) to (A7), (A10) and (C21) to (C27) shown later). This enhances luminous efficiency of white, and also enhances color purity of white since the half bandwidth of the spectrum increases.

EXAMPLES (1) First, organic EL devices of Examples 1 to 33 and Examples for Comparison, 1 to 5, were constructed and luminescence characteristics of these devices were measured.

Organic EL devices of Examples 1-10 and Comparative Example 1 have Device Structure A, organic EL devices of Examples 11-22 and Comparative Example 2 have Device Structure B, organic EL devices of Examples 23-28 and Comparative Examples 3-5 have Device Structure C, and organic EL devices of Examples 29-33 have Device Structure D.

In particular, rubrene derivatives having the molecular structures of Formulas (A1)-(A10) below were used as materials of the light emitting layer.

5,6,11,12-tetrakis(naphth-2-yl)-naphthacene (hereinafter referred to as TNN):

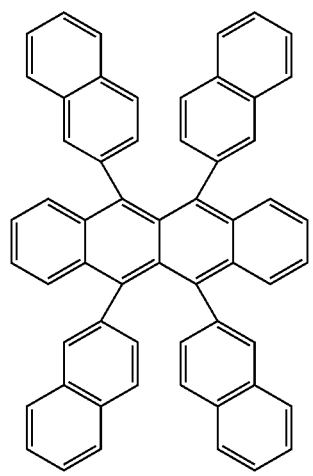

TNN (A1)

5,12-bis(4-(6-methylbenzothiazole-2-yl)phenyl)-6,11-diphenylnaphthacene (hereinafter referred to as DBZR):

(A2)

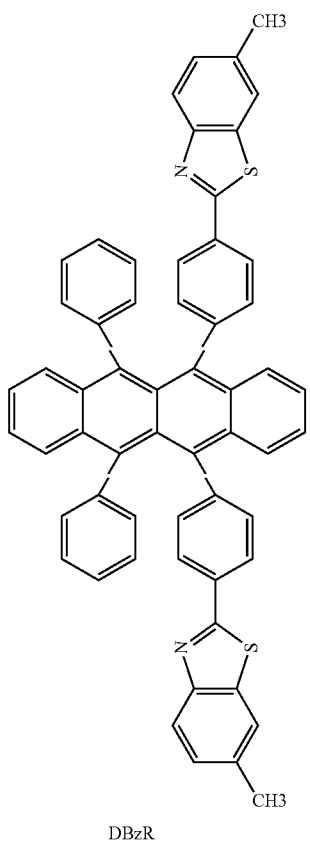

DBzR 5,6,11,12-tetrakis(4-tert-butylphenyl)-naphthacene (hereinafter referred to as TtBuPN):

(A3)

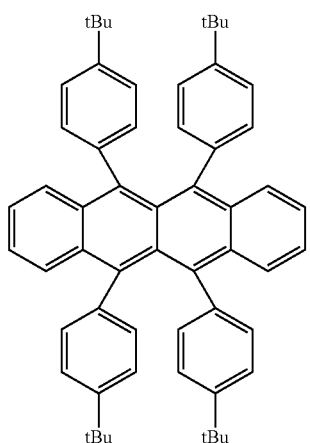

TtBuPN 5,12-bis(4-tert-butylphenyl)-naphthacene (hereinafter referred to as DtBuPN):

(A4)

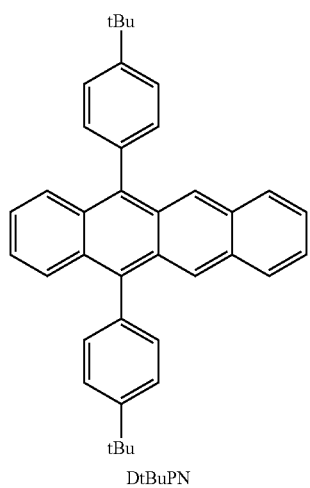

DtBuPN 5,12-diphenylnaphthacene (hereinafter referred to as DPN):

(A5)

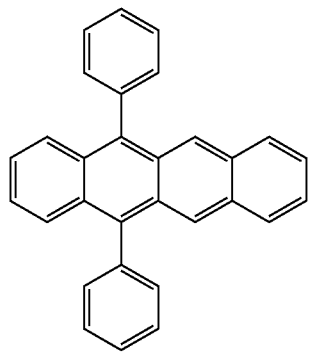

DPN 5,12-bis(naphth-2-yl)-naphthacene(hereinafter referred to as DNN):

(A6)

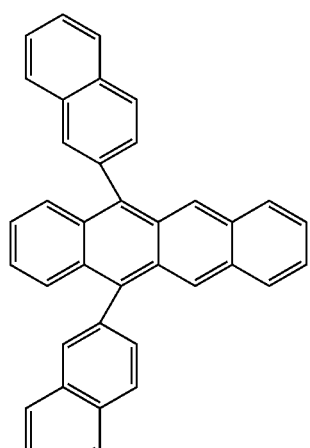

DNN 5,12-bis(pyrene-1-yl)-naphthacene(hereinafter referred to as DPyN):

(A7)

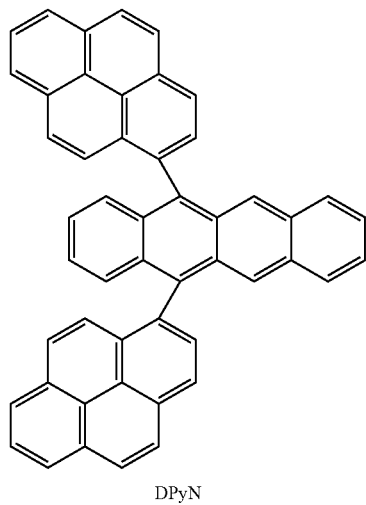

DPyN 5,6,13,14-6-tetrakisphenyl-pentacene (hereinafter referred to as TPhP):

(A8)

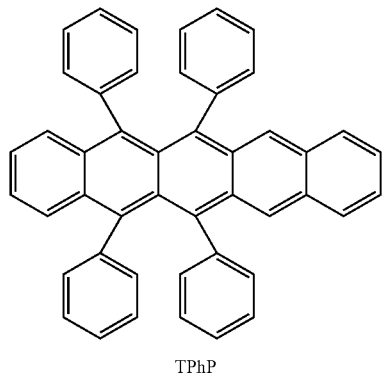

TPhP 6,13-bis(4-(6-methylbenzothiazole-2-yl)phenyl)-pentacene (hereinafter referred to as DBZP):

(A9)

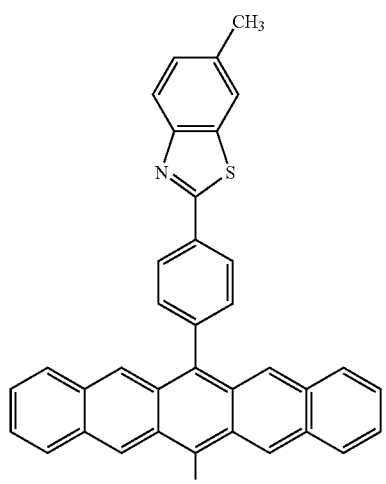

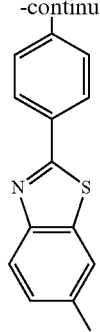

5,6,11,12-tetrakisphenyl-1,2-benzo-(3,4-benzo-)naphthacene (hereinafter referred to as TPh-DBN):

(A10)

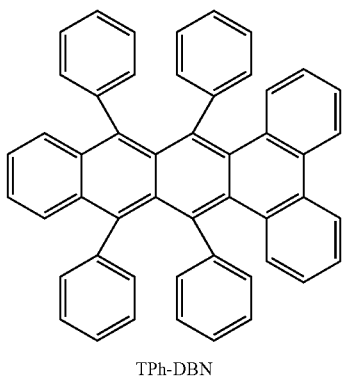

TPh-DBN (A) Device Structure A

In Device Structure A, a hole injecting electrode (anode), a hole injecting layer, a hole transporting layer, a light emitting layer, and an electron injecting electrode (cathode) are sequentially stacked on a glass substrate.

In this case, the hole injecting electrode of the organic EL device has a thickness of 1000 Å and is formed of indium-tin oxide (ITO). The hole injecting layer has a thickness of 500 Å and is formed of 4,4',4"-Tris(N-(2-naphthyl)-N-phenyl-amino)-triphenylamine (hereinafter referred to as 2TNATA) having the molecular structure represented by Formula (22) below.

(22)

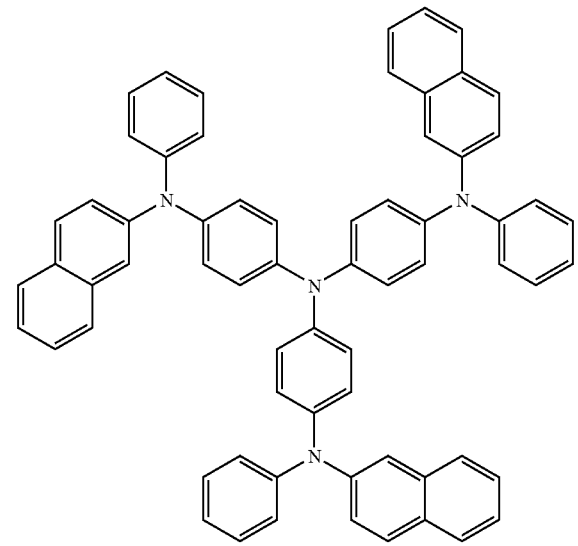

The hole transporting layer has a thickness of 150 Å and is formed of N,N'-Di(naphthalen-1-yl)-N,N'-diphenyl-benzidine (hereinafter referred to as NPB) having the molecular structure of Formula (23).

(23)

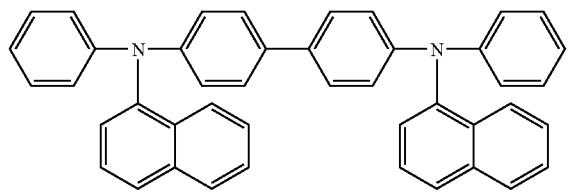

The light emitting layer has a thickness of 500 Å, and contains, as a host material, Tris(8-hydroxyquinolinato)aluminum (hereinafter referred to as Alq) having the molecular structure of Formula (24) below, and contains, as a red light emitting dopant, 2% of 2-(1,1-Dimethylethyl)-6-(2-(2,3,6,7-tetrahydro-1,1,7,7-tetramethyl-1H,5H-benzo[ij]quinolizin-9-yl)ethenyl)-4H-pyran-4-ylidene)propanedinitrile (hereinafter referred to as DCJTB) having the molecular structure of Formula (25), and also contains, as a first light-emission assisting dopant, 5% of a rubrene derivative, or one of those shown above.

(24)

(25)

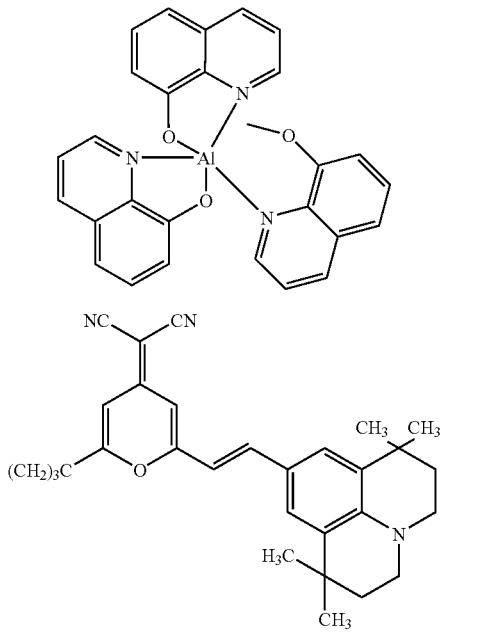

The electron injecting electrode is formed of a MgIn alloy (a ratio of 10:1) with a thickness of 2000 Å.

Examples 1-10 used, as first light-emission assisting dopants, DtBuPN, DPN, DNN, TNN, DBzR, DPyN, TtBuPN, DBZP, TPhP, and TPh-DBN, respectively. Comparative Example 1 used rubrene as a first light-emission assisting dopant.

(B) Device Structure B

In Device Structure B, a hole injecting electrode (anode), a hole injecting layer, a hole transporting layer, a light emitting layer, and an electron injecting electrode (cathode) are sequentially stacked on a glass substrate.

In this case, the hole injecting electrode of the organic EL device has a thickness of 1000 Å and is formed of indium-tin oxide (ITO). The hole injecting layer has a thickness of 500 Å and is formed of 2TNATA. The hole transporting layer has a thickness of 150 Å and is formed of NPB.

The light emitting layer has a thickness of 500 Å, and contains Alq as a host material, 2% of DCJTB as a red-emitting dopant, 5% of a rubrene derivative, one of the rubrene derivatives shown above, as a first light-emission assisting dopant, and also contains, as a second light-emission assisting dopant, 6% of 4,4-Bis(carbazol-9-yl)-biphenyl (hereinafter referred to as CBP) having the molecular structure of Formula (26), or N,N'-Bis-(3-methylphenyl)-N,N'-bis-(phenyl)-benzidine (hereinafter referred to as TPD) having the molecular structure of Formula (27) below, or NPB.

(26)

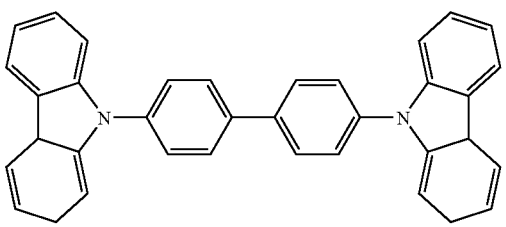

(27)

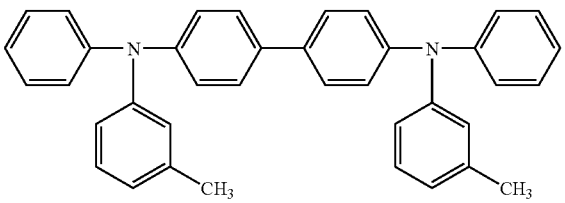

The electron injecting electrode has a thickness of 2000 Å and is formed of a MgIn alloy (with a ratio of 10:1).

Examples 11-20 used, as first light-emission assisting dopants, DtBuPN, DPN, DNN, TNN, DBzR, DPyN, TtBuPN, DBzP, TPhP, and TPh-DBN, respectively. Comparative Example used rubrene as the first light-emission assisting dopant.

Example 21 used DtBuPN as the first light-emission assisting dopant and TPD as the second light-emission assisting dopant. Example 22 used DPN as the first light-emission assisting dopant and NPB as the second light-emission assisting dopant.

(C) Device Structure C

In Device Structure C, a hole injecting electrode (anode), a hole injecting layer, a hole transporting layer, a light emitting layer, and an electron injecting electrode (cathode) are sequentially stacked on a glass substrate.

In this case, the hole injecting electrode of the organic EL device has a thickness of 1000 Å and is formed of indium-tin oxide (ITO). The hole injecting layer has a thickness of 500 Å and is formed of 2TNATA. The hole transporting layer has a thickness of 150 Å and is formed of NPB.

The light emitting layer has a thickness of 500 Å, and contains Alq as a host material, and 5% of a rubrene derivative, one of those shown above, as a light emitting dopant.

The electron injecting electrode is formed of a MgIn alloy (a ratio of 10:1) with a thickness of 2000 Å.

Examples 23-28 used, as the light emitting dopants, DtBuPN, DPN, DNN, TNN, DBzR, and DPyN, respectively. Comparative Examples 3-5 respectively used, as light emitting dopants, Coumarin6 (or 3-(2-Benzothiazolyl)-7-(diethylamino)coumarin) having the molecular structure of Formula (28), rubrene, and 4-(Dicyanomethylene)-2-methyl-6-(4- dimethylaminostyryl)-4H-pyran (hereinafter referred to as DCM) having the molecular structure of Formula (29).

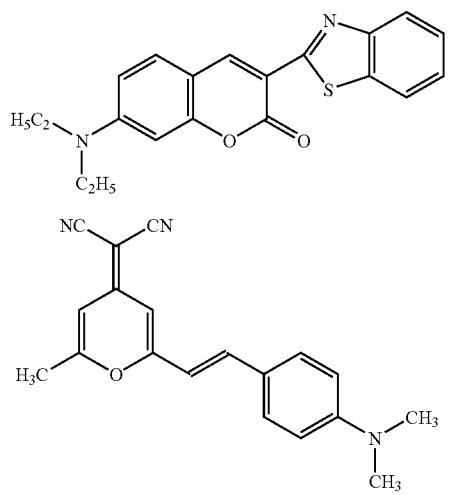

(28)

(29)

(D) Device Structure D

In Device Structure D, a hole injecting electrode (anode), a hole injecting layer, a hole transporting layer, a light emitting layer, an electron transporting layer, and an electron injecting electrode (cathode) are sequentially stacked on a glass substrate.

In this case, the hole injecting electrode of the organic EL device is formed of indium-tin oxide (ITO) with a thickness of 1000 Å. The hole injecting layer has a thickness of 500 Å and is formed of 2TNATA.

The light emitting layer has a thickness of 150 Å, and contains NPB as a host material, and 5% of a rubrene derivative, one of those shown above, as a light emitting dopant.

The electron transporting layer has a thickness of 500 Å and is formed of Alq. The electron injecting electrode is formed of MgIn alloy (a ratio of 10:1) with a thickness of 2000 Å.

Examples 29-33 used, as the light emitting dopants, DtBuPN, DPN, DNN, TNN, and DBzR, respectively.

A positive bias voltage was applied to the hole injecting electrode of each organic EL device and a negative bias voltage was applied to the electron injecting electrode, and luminescence characteristics of the devices were measured.

Table 1 shows measurements of luminescence characteristics of the organic EL devices of Examples 1-10 and Comparative Example 1.

TABLE 1

| | DEVICE STRUCTURE | HOST | LIGHT EMITTING DOPANT | 1st LIGHT-EMISSION ASSISTING DOPANT | 2nd LIGHT-EMISSION ASSISTING DOPANT | EMITTED COLOR (CIEx, y) | LUMINOUS EFFICIENCY (cd/A) At100 cd/m² | WAVE-LENGTH (nm) | MAX LUMINANCE (cd/m²) |
|---|---|---|---|---|---|---|---|---|---|
| EX. 1 | A | Alq | DCJTB | DtBuPN | — | Red x = 0.65, y = 0.35 | 1.1 | 633 | 8,050 |
| EX. 2 | A | Alq | DCJTB | DPN | — | Red x = 0.65, y = 0.35 | 1.6 | 632 | 10,100 |
| EX. 3 | A | Alq | DCJTB | DNN | — | Red x = 0.65, y = 0.35 | 1.1 | 633 | 7,960 |
| EX. 4 | A | Alq | DCJTB | TNN | — | Red x = 0.65, y = 0.35 | 1.4 | 633 | 9,030 |
| EX. 5 | A | Alq | DCJTB | DBzR | — | Red x = 0.65, y = 0.35 | 1.5 | 634 | 9,500 |
| EX. 6 | A | Alq | DCJTB | DPyN | — | Red x = 0.65, y = 0.35 | 1.1 | 635 | 7,900 |
| EX. 7 | A | Alq | DCJTB | TtBuPN | — | Red x = 0.65, y = 0.35 | 1.5 | 634 | 9,600 |
| EX. 8 | A | Alq | DCJTB | DBzP | — | Red x = 0.65, y = 0.35 | 1.1 | 637 | 7,600 |
| EX. 9 | A | Alq | DCJTB | TPhP | — | Red x = 0.65, y = 0.35 | 1.1 | 635 | 7,400 |
| EX. 10 | A | Alq | DCJTB | TPh-DBN | — | Red x = 0.65, y = 0.35 | 1.1 | 635 | 7,700 |
| Comparison 1 | A | Alq | DCJTB | Rubrene | — | Red x = 0.65, y = 0.35 | 1.0 | 635 | 7,300 |

As shown in Table 1, the organic EL devices of Examples 1-10 and Comparative Example 1 all provided red light emission with high color purity. The organic EL devices of Examples 1-10 provided higher luminous efficiency and higher maximum luminance than the organic EL device of Comparative Example 1. This shows that the use of the rubrene derivatives as the first light-emission assisting dopants is effective in enhancing the luminous efficiency and maximum luminance.

Table 2 shows measurements of luminescence characteristics of the organic EL devices of Examples 11-20 and Comparative Example 2.

emission with high color purity. With the organic EL devices of Examples 11-20, the addition of the second light-emission assisting dopant enabled higher luminous efficiency and higher maximum luminance than those of the organic EL devices of Examples 1-11. This shows that the addition of the second light-emission assisting dopant is effective in enhancing the luminous efficiency and maximum luminance. The organic EL devices of Examples 11-20 provided higher luminous efficiency than the organic EL device of Example 2. This shows that using the rubrene derivatives as the first light-emission assisting dopants is effective in enhancing the luminous efficiency and maximum luminance.

TABLE 2

| | DEVICE STRUCTURE | HOST | LIGHT EMITTING DOPANT | 1st LIGHT-EMISSION ASSISTING DOPANT | 2nd LIGHT-EMISSION ASSISTING DOPANT | EMITTED COLOR (CIEx, y) | LUMINOUS EFFICIENCY (cd/A) At100 cd/m$^2$ | WAVELENGTH (nm) | MAX LUMINANCE (cd/m$^2$) |
|---|---|---|---|---|---|---|---|---|---|
| EX. 11 | B | Alq | DCJTB | DtBuPN | CBP | Red x = 0.65, y = 0.35 | 2.1 | 634 | 14,450 |
| EX. 12 | B | Alq | DCJTB | DPN | CBP | Red x = 0.65, y = 0.35 | 2.7 | 632 | 18,100 |
| EX. 13 | B | Alq | DCJTB | DNN | CBP | Red x = 0.65, y = 0.35 | 2.1 | 634 | 13,660 |
| EX. 14 | B | Alq | DCJTB | TNN | CBP | Red x = 0.65, y = 0.35 | 2.5 | 634 | 15,080 |
| EX. 15 | B | Alq | DCJTB | DBzR | CBP | Red x = 0.65, y = 0.35 | 2.5 | 635 | 16,100 |
| EX. 16 | B | Alq | DCJTB | DPyN | CBP | Red x = 0.65, y = 0.35 | 2.1 | 635 | 7,900 |
| EX. 17 | B | Alq | DCJTB | TtBuPN | CBP | Red x = 0.65, y = 0.35 | 2.5 | 634 | 15,000 |
| EX. 18 | B | Alq | DCJTB | DBzP | CBP | Red x = 0.65, y = 0.35 | 2.1 | 637 | 8,100 |
| EX. 19 | B | Alq | DCJTB | TPhP | CBP | Red x = 0.65, y = 0.35 | 2.1 | 635 | 8,200 |
| EX. 20 | B | Alq | DCJTB | TPh-DBN | CBP | Red x = 0.65, y = 0.35 | 2.1 | 635 | 8,100 |
| Comparison 2 | B | Alq | DCJTB | Rubrene | CBP | Red x = 0.65, y = 0.35 | 2.0 | 634 | 12,820 |

As shown in Table 2, the organic EL devices of Examples 11-20 and Comparative Example 2 all provided red light Table 3 shows measurements of luminescence characteristics of the organic EL devices of Examples 21 and 22.

TABLE 3

| | DEVICE STRUCTURE | HOST | LIGHT EMITTING DOPANT | 1st LIGHT-EMISSION ASSISTING DOPANT | 2nd LIGHT-EMISSION ASSISTING DOPANT | EMITTED COLOR (CIEx, y) | LUMINOUS EFFICIENCY (cd/A) At100 cd/m$^2$ | WAVELENGTH (nm) | MAX LUMINANCE (cd/m$^2$) |
|---|---|---|---|---|---|---|---|---|---|
| EX. 21 | B | Alq | DCJTB | DtBuPN | TPD | Red x = 0.65, y = 0.35 | 2.1 | 634 | 14,000 |
| EX. 22 | B | Alq | DCJTB | DPN | NPB | Red x = 0.65, y = 0.35 | 2.6 | 632 | 19,100 |

As shown in Table 3, the organic EL devices of Examples 21 and 22 both provided red light emission with high color purity. With the organic EL devices of Examples 21 and 22, too, the addition of the second light-emission assisting dopant enhanced the luminous efficiency and maximum luminance, as compared with those of the organic EL devices of Examples 1-11. This shows that adding a second light-emission assisting dopant is effective in enhancing the luminous efficiency and maximum luminance. The organic EL devices of Examples 21 and 22, too, provided higher luminous efficiency than the organic EL device of Comparative Example 2. This shows that using rubrene derivatives as the first light-emission assisting dopants is effective in enhancing the luminous efficiency and maximum luminance also when TPD or NPB is used as a second light-emission assisting dopant.

Table 4 shows measurements of luminescence characteristics of the organic EL devices of Examples 23-28 and Comparative Examples 3-5.

TABLE 4

| | DEVICE STRUCTURE | HOST | LIGHT EMITTING DOPANT | 1st LIGHT-EMISSION ASSISTING DOPANT | 2nd LIGHT-EMISSION ASSISTING DOPANT | EMITTED COLOR (CIEx, y) | LUMINOUS EFFICIENCY (cd/A) At 100 cd/m$^2$ | WAVELENGTH (nm) | MAX LUMINANCE (cd/m$^2$) |
|---|---|---|---|---|---|---|---|---|---|
| EX. 23 | C | Alq | DtBuPN | — | — | Green x = 0.30, y = 0.68 | 9.0 | 538 | 41,800 |
| EX. 24 | C | Alq | DPN | — | — | Green x = 0.29, y = 0.62 | 4.2 | 534 | 18,800 |
| EX. 25 | C | Alq | DNN | — | — | Green x = 0.31, y = 0.65 | 5.8 | 540 | 23,000 |
| EX. 26 | C | Alq | TNN | — | — | Orange x = 0.50, y = 0.49 | 6.8 | 578 | 45,400 |
| EX. 27 | C | Alq | DBzR | — | — | Orange x = 0.50, y = 0.49 | 4.6 | 585 | 26,000 |
| EX. 28 | C | Alq | DPyN | — | — | Green x = 0.29, y = 0.68 | 4.1 | 541 | 25,700 |
| Comparison 3 | C | Alq | Coumarin 6 | — | — | Green x = 0.31, y = 0.66 | 3.5 | 538 | 18,000 |
| Comparison 4 | C | Alq | Rubrene | — | — | Yellow x = 0.49, y = 0.50 | 6.5 | 560 | 40,100 |
| Comparison 5 | C | Alq | DCM | — | — | Orange x = 0.53, y = 0.47 | 2.0 | 575 | 10,200 |

As shown in Table 4, the organic EL devices of Examples 23-28 provided luminous efficiencies of 4.1 to 9.0 cd/A, which are higher than those of the organic EL devices of Comparison Examples 3-5. This shows that using the rubrene derivatives as light emitting dopants, too, is effective in enhancing the luminous efficiency and maximum luminance.

Table 5 shows measurements of luminescence characteristics of the organic EL devices of Examples 29-33.

TABLE 5

| | DEVICE STRUCTURE | HOST | LIGHT EMITTING DOPANT | 1st LIGHT-EMISSION ASSISTING DOPANT | 2nd LIGHT-EMISSION ASSISTING DOPANT | EMITTED COLOR (CIEx, y) | LUMINOUS EFFICIENCY (cd/A) At 100 cd/m$^2$ | WAVELENGTH (nm) | MAX LUMINANCE (cd/m$^2$) |
|---|---|---|---|---|---|---|---|---|---|
| EX. 29 | D | NPB | DtBuPN | — | — | Green x = 0.29, y = 0.67 | 7.8 | 535 | 36,100 |
| EX. 30 | D | NPB | DPN | — | — | Green x = 0.30, y = 0.62 | 3.6 | 532 | 27,700 |
| EX. 31 | D | NPB | DNN | — | — | Green x = 0.30, y = 0.68 | 6.2 | 540 | 33,900 |
| EX. 32 | D | NPB | TNN | — | — | Yellow x = 0.46, y = 0.53 | 9.0 | 570 | 40,500 |

TABLE 5-continued

| | DEVICE STRUCTURE | HOST | LIGHT EMITTING DOPANT | 1st LIGHT-EMISSION ASSISTING DOPANT | 2nd LIGHT-EMISSION ASSISTING DOPANT | EMITTED COLOR (CIEx, y) | LUMINOUS EFFICIENCY (cd/A) At100 cd/m$^2$ | WAVE-LENGTH (nm) | MAX LUMINANCE (cd/m$^2$) |
|---|---|---|---|---|---|---|---|---|---|
| EX. 33 | D | NPB | DBzR | — | — | Yellow x = 0.49, y = 0.51 | 12.5 | 559 | 46,600 |

As shown in Table 5, the organic EL devices of Examples 29-33 provided high luminous efficiencies of 3.6 to 12.5 cd/A. This shows that using the rubrene derivatives as light emitting dopants with an electron transporting layer replacing the hole transporting layer is also effective in enhancing the luminous efficiency and maximum luminance.

Thus, it is seen from Examples 1-33 and Comparative Examples 1-5 that using the rubrene derivatives shown above as a light emitting dopant or first light-emission assisting dopant in a light emitting layer improves luminous efficiency and luminance.

(2) Next, organic EL devices of Examples 34-108 were constructed and luminescence characteristics of these devices were measured.

Organic EL devices of Examples 34-40 have Device Structure E, organic EL devices of Examples 41-67 have Device Structure F, organic EL devices of Examples 68-94 have Device Structure G, and organic EL devices of Examples 95-108 have Device Structure H.

Examples 34-40 used rubrene derivatives having molecular structures of Formula (1a) below, among rubrene derivatives represented by Formula (1) shown earlier, rubrene derivatives having molecular structures of Formula (2a) among rubrene derivatives represented by Formula (2), and rubrene derivatives having molecular structures of Formula (4a) among rubrene derivatives represented by Formula (4).

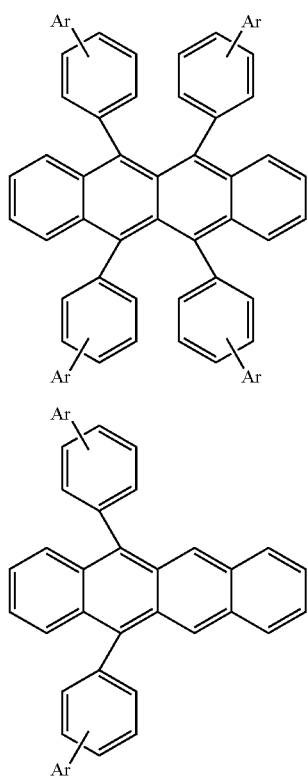

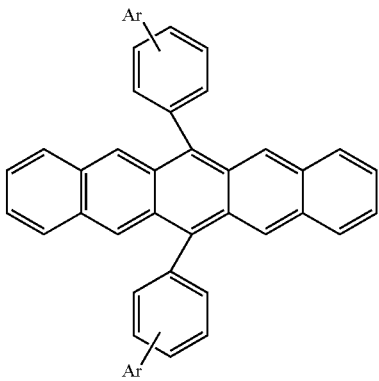

In Formulas (1a), (2a) and (4a), Ar represents a substituent having any of the structures represented by Formula (7a).

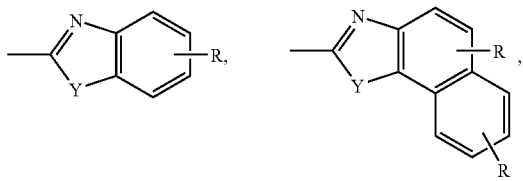

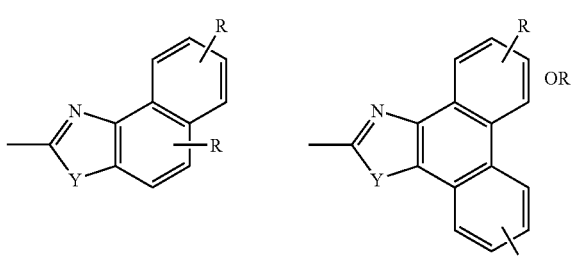

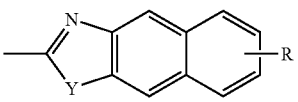

In Formula (7a), Y is O or S, R is a hydrogen atom, a halogen atom, or a substituent, such as —H, —C$_n$H$_{2n+1}$ (n=1-10), —OC$_n$H$_{2n+1}$ (n=1-10), —N(C$_n$H$_{2n+1}$)$_2$ (n=1-10), —X (X=—F, —Cl, —Br, or —I), —CN, a phenyl group, or a naphthyl group.

In particular, Compounds 1-27 having molecular structures of Formulas (C1)-(C27) below were used as materials of the light emitting layer.

COMPOUND 1:
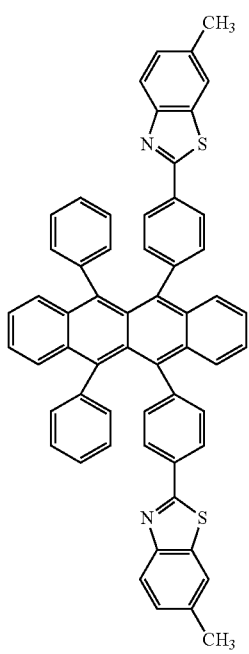
(C1)
COMPOUND 2:
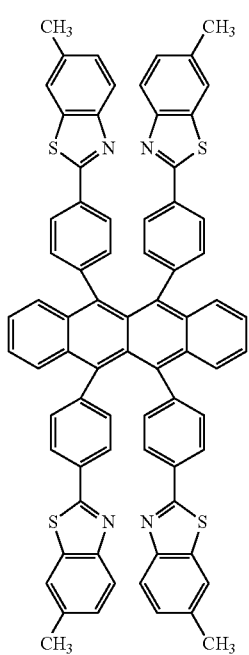
(C2)
COMPOUND 3:
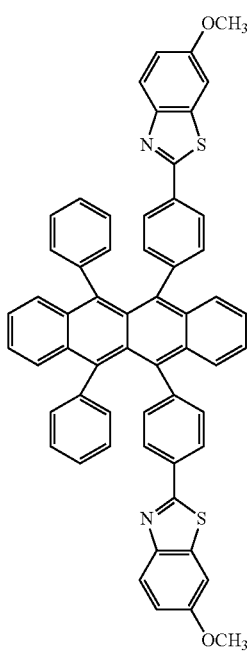
(C3)
COMPOUND 4:
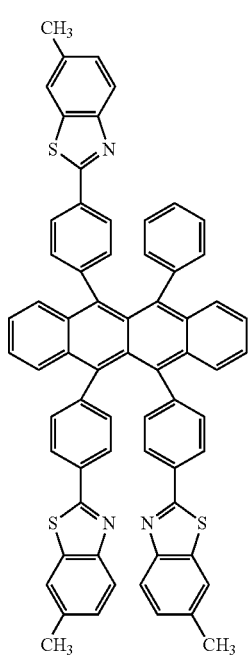
(C4)

-continued
COMPOUND 5:
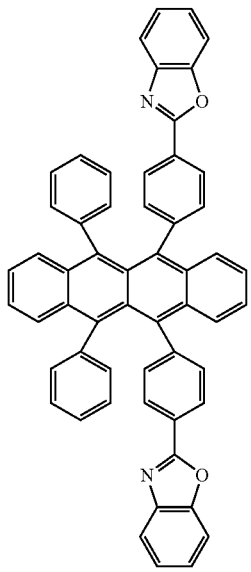
(C5)
COMPOUND 6:
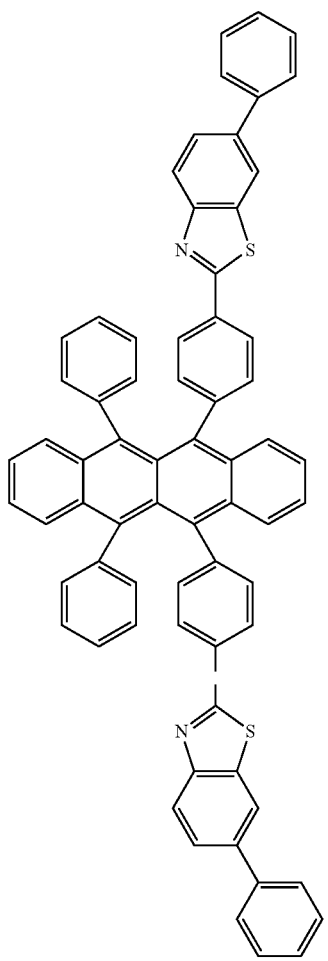
(C6)
-continued
COMPOUND 7:
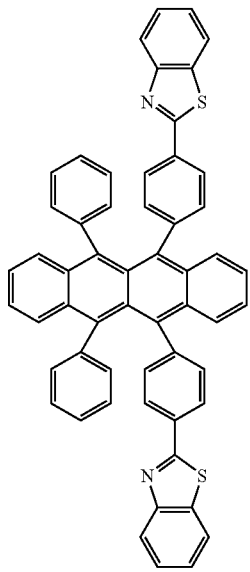
(C7)
COMPOUND 8:
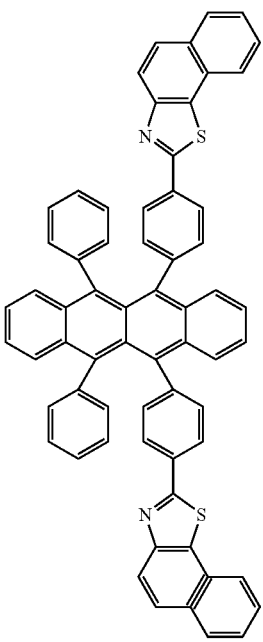
(C8)

-continued
COMPOUND 9:
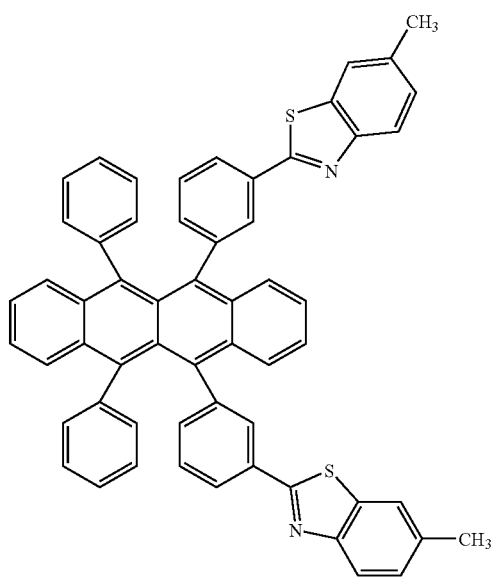
(C9)
COMPOUND 11:
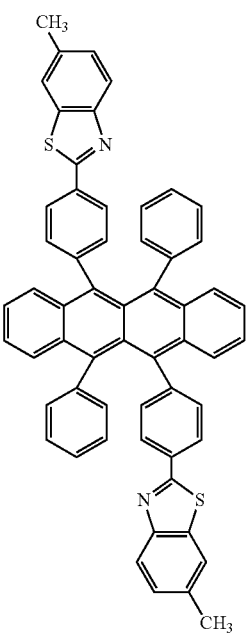
(C11)
COMPOUND 10:
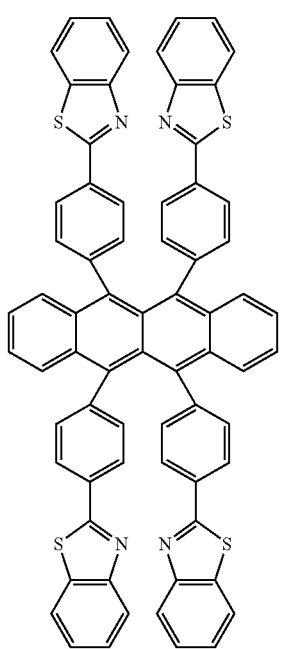
(C10)
COMPOUND 12:
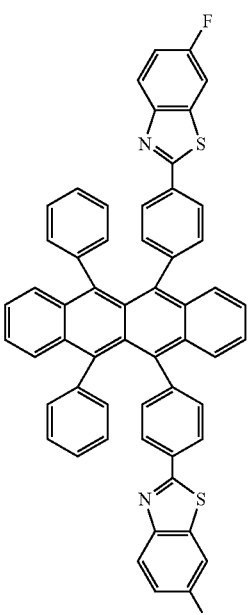
(C12)

COMPOUND 13:
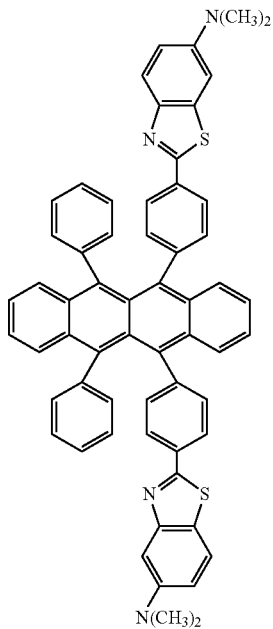
(C13)
COMPOUND 15:
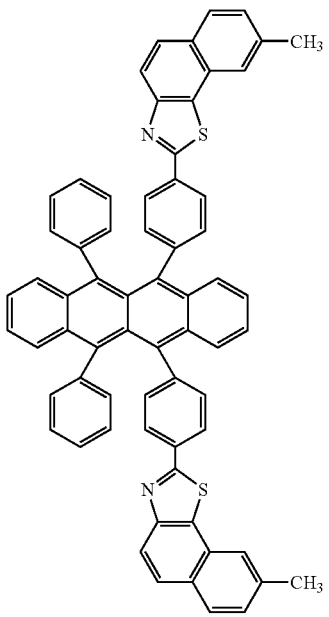
(C15)
COMPOUND 14:
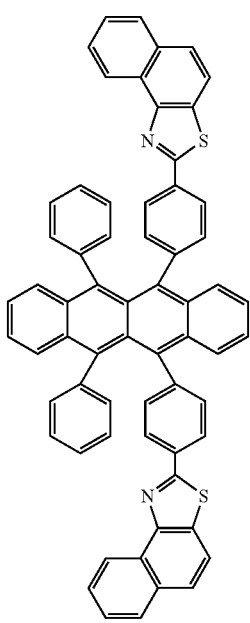
(C14)
COMPOUND 16:
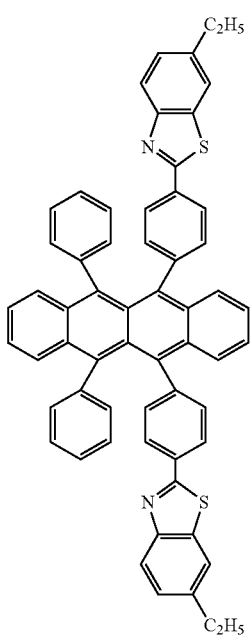
(C16)

COMPOUND 17:
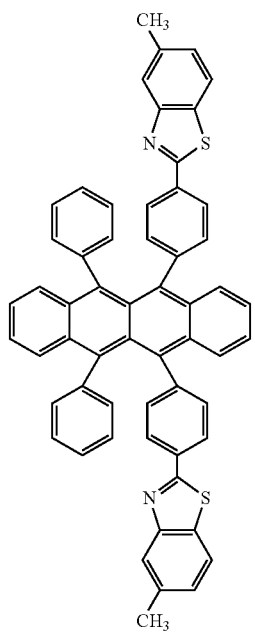
(C17)
COMPOUND 19:
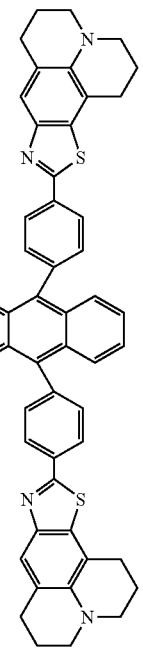
(C19)
COMPOUND 18:
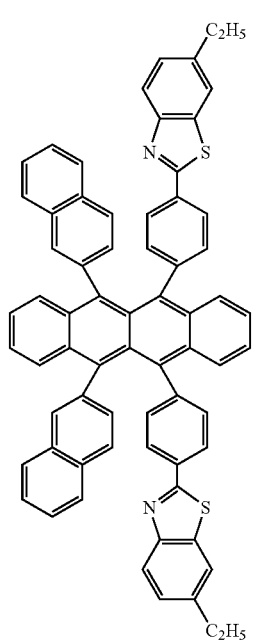
(C18)
COMPOUND 20:
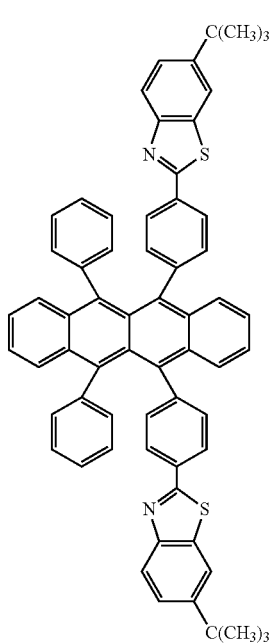
(C20)

-continued
COMPOUND 21:
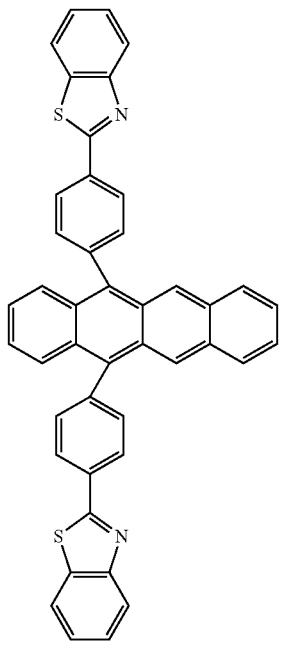
(C21)
COMPOUND 22:
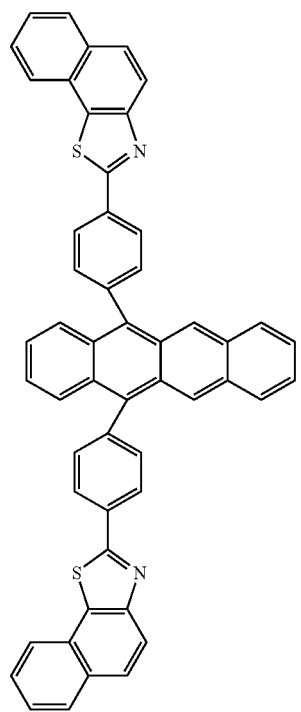
(C22)
-continued
COMPOUND 23:
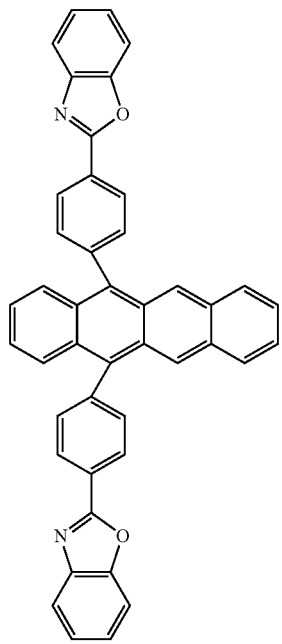
(C23)
COMPOUND 24:
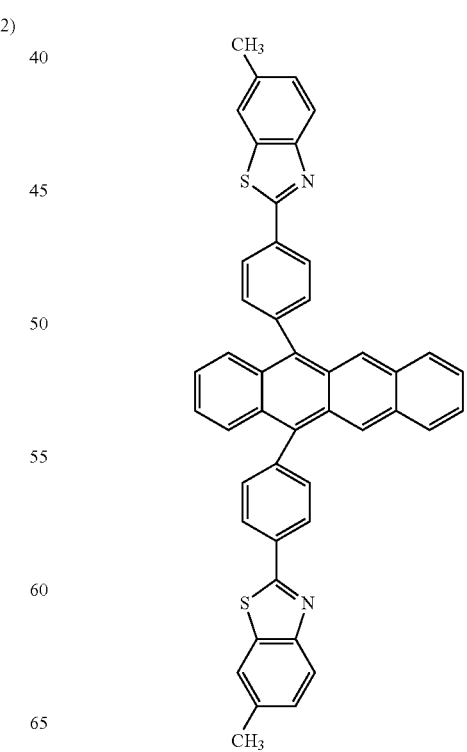
(C24)

-continued

COMPOUND 25:

(C25)

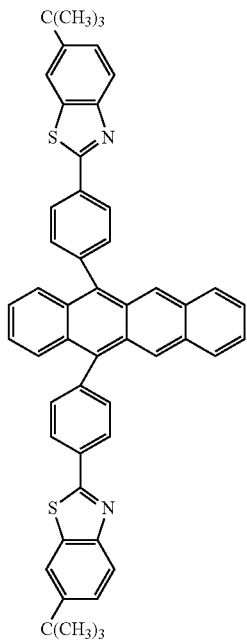

COMPOUND 26:

(C26)

-continued

COMPOUND 27:

(C27)

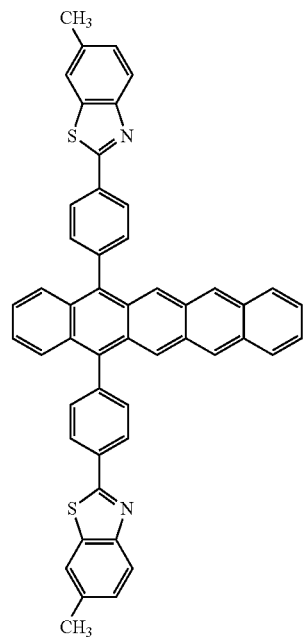

(E) Device Structure E

In Device Structure E, a hole injecting electrode (anode), a hole injecting layer, a hole transporting layer, a light emitting layer, an electron transporting layer, and an electron injecting electrode (cathode) are sequentially stacked on a glass substrate.

In this case, the hole injecting electrode of the organic EL device has a thickness of 1000 Å and is formed of indium-tin oxide (ITO). The hole injecting layer has a thickness of 100 Å and is formed of copper phthalocyanine (hereinafter referred to as CuPc).

The hole transporting layer has a thickness of 500 Å and is formed of NPB having the molecular structure of Formula (23) shown before.

The light emitting layer has a thickness of 400 Å, and contains, as a host material, Alq having the molecular structure of Formula (24) above, and contains, as a red light emitting dopant, 2% of DCJTB having the molecular structure of Formula (25) above, and also contains, as a light-emission assisting dopant, 5% of a rubrene derivative, one of those shown above.

Examples 34-40 respectively used, as the light-emission assisting dopants, Compounds 1, 3, 7, 8, 16, 17 and 18 represented by Formulas (C1), (C3), (C7), (C8), (C16), (C17) and (C18).

The electron transporting layer is formed of Alq with a thickness of 100 Å. The electron injecting electrode is formed of LiF/Al with a thickness of 2000 Å.

(F) Device Structure F

In Device Structure F, a hole injecting electrode (anode), a hole injecting layer, a hole transporting layer, a light emitting layer, an electron transporting layer, and an electron injecting electrode (cathode) are sequentially stacked on a glass substrate.

In this case, the hole injecting electrode of the organic EL device has a thickness of 1000 Å and is formed of indium-tin oxide (ITO). The hole injecting layer has a thickness of 100 Å and is formed of CuPc.

The hole transporting layer has a thickness of 500 Å and is formed of NPB having the molecular structure of Formula (23).

The light emitting layer has a thickness of 400 Å, and contains Alq having the molecular structure of Formula (24) as a host material, and 5% of a rubrene derivative, one of the rubrene derivatives shown above, as a light emitting dopant.

Examples 41-67 respectively used Compounds 1-27 of Formulas (C1)-(C27) as the light emitting dopants.

The electron transporting layer is formed of Alq with a thickness of 100 Å. The electron injecting electrode is formed of LiF/Al with a thickness of 2000 Å.

(G) Device Structure G

In Device Structure G, a hole injecting electrode (anode), a hole injecting layer, a hole transporting layer, a light emitting layer, an electron transporting layer, and an electron injecting electrode (cathode) are sequentially stacked on a glass substrate.

In this case, the hole injecting electrode of the organic EL device has a thickness of 1000 Å and is formed of indium-tin oxide (ITO). The hole injecting layer has a thickness of 100 Å and is formed of CuPc.

The hole transporting layer has a thickness of 500 Å and is formed of NPB having the molecular structure of Formula (23) shown above.

The light emitting layer has a thickness of 400 Å, and contains NPB having the molecular structure of Formula (23) as a host material, and 5% of a rubrene derivative, one of those shown above, as a light emitting dopant.

Examples 68-94 used Compounds 1-27 of Formulas (C1)-(C27) as light emitting dopants.

The electron transporting layer is formed of Alq with a thickness of 100 Å. The electron injecting electrode is formed of LiF/Al with a thickness of 2000 Å.

(H) Device Structure H

In Device Structure H, a hole injecting electrode (anode), a hole injecting layer, a hole transporting layer, a first light emitting layer, a second light emitting layer, an electron transporting layer, and an electron injecting electrode (cathode) are sequentially stacked on a glass substrate.

In this case, the hole injecting electrode of the organic EL device has a thickness of 1000 Å and is formed of indium-tin oxide (ITO). The hole injecting layer has a thickness of 100 Å and is formed of CuPc.

The hole transporting layer has a thickness of 400 Å and is formed of NPB having the molecular structure of Formula (23) shown above.

The first light emitting layer has a thickness of 100 Å, and contains, as a host material, NPB having the molecular structure of Formula (23), and contains, as a light emitting dopant(s), 2% (Examples 95-104) or 8% (Examples 105-108) of one or ones of rubrene derivatives shown above.

Examples 95-104 respectively used, as light emitting dopants in the first light emitting layer, Compounds 1, 1, 3, 7, 8, 16, 17, 18, 19 and 20 of Formulas (C1), (C1), (C3), (C7), (C8), (C16), (C17), (C18), (C19) and (C20).

The second light emitting layer has a thickness of 300 Å, and contains, as a host material, diphenylanthracene having the molecular structure of Formula (B2) and contains, as a light emitting dopant, 2% of perylene of Formula (B3) shown earlier.

In Examples 105-108, in order to enhance the luminous efficiency of white and to increase the half bandwidth of the spectrum to enhance color purity of white, the first light emitting layer was doped with two kinds of light emitting dopants: an orange-emitting rubrene derivative and a green-emitting rubrene derivative.

Example 105 used Compound 1 of Formula (C1) and DtBuPN of Formula (A4) as light emitting dopants in the first light emitting layer. Example 106 used Compound 1 of Formula (C1) and Compound 24 of Formula (C24) as light emitting dopants in the first light emitting layer. Example 107 used Compound 7 of Formula (C7) and Compound 25 of Formula (C25) as light emitting dopants in the first light emitting layer. Example 108 used Compound 9 of Formula (C9) and Compound 26 of Formula (26) as light emitting dopants in the first light emitting layer.

The electron transporting layer is formed of Alq with a thickness of 100 Å. The electron injecting electrode is formed of LiF/Al with a thickness of 2000 Å.

A positive bias voltage was applied to the hole injecting electrode of each organic EL device and a negative bias voltage was applied to the electron injecting electrode, and luminescence characteristics of the devices were measured.

Table 6 shows measurements of luminescence characteristics of the organic EL devices of Examples 34-40.

TABLE 6

| EX. | HOLE INJECTING LAYER | HOLE TRANSPORTING LAYER | LIGHT-EMITTING LAYER | ELECTRON TRANSPORTING LAYER | EMITTED COLOR (CIEx, y) | LUMINOUS EFFICIENCY (cd/A) At100 cd/m$^2$ | WAVE-LENGTH (nm) | MAX LUMINANCE (cd/m$^2$) |
|---|---|---|---|---|---|---|---|---|
| 34 | CuPc | NPB | Alq + 2% DCJTB + 5% Compound1 | Alq | Red x = 0.65, y = 0.35 | 3.9 | 638 | 24,000 |
| 35 | CuPc | NPB | Alq + 2% DCJTB + 5% Compound3 | Alq | Red x = 0.65, y = 0.35 | 3.7 | 639 | 21,000 |
| 36 | CuPc | NPB | Alq + 2% DCJTB + 5% Compound7 | Alq | Red x = 0.65, y = 0.35 | 3.8 | 638 | 23,000 |
| 37 | CuPc | NPB | Alq + 2% DCJTB + 5% Compound8 | Alq | Red x = 0.65, y = 0.35 | 3.2 | 638 | 19,000 |
| 38 | CuPc | NPB | Alq + 2% DCJTB + 5% Compound16 | Alq | Red x = 0.65, y = 0.35 | 3.8 | 638 | 23,000 |

TABLE 6-continued

| EX. | HOLE INJECTING LAYER | HOLE TRANSPORTING LAYER | LIGHT-EMITTING LAYER | ELECTRON TRANSPORTING LAYER | EMITTED COLOR (CIEx, y) | LUMINOUS EFFICIENCY (cd/A) At100 cd/m$^2$ | WAVE-LENGTH (nm) | MAX LUMINANCE (cd/m$^2$) |
|---|---|---|---|---|---|---|---|---|
| 39 | CuPc | NPB | Alq + 2% DCJTB + 5% Compound17 | Alq | Red x = 0.65, y = 0.35 | 3.5 | 638 | 22,000 |
| 40 | CuPc | NPB | Alq + 2% DCJTB + 5% Compound18 | Alq | Red x = 0.65, y = 0.35 | 3.6 | 638 | 22,000 |

As shown in Table 6, the organic EL devices of Examples 34-40 all provided red light emission with high color purity. The organic EL devices of Examples 39-40 provided high luminous efficiency and high maximum luminance. This shows that the use of the rubrene derivatives as light-emission assisting dopants is effective in enhancing the luminous efficiency and maximum luminance.

Tables 7 and 8 show measurements of luminescence characteristics of the organic EL devices of Examples 41-67.

TABLE 7

| EX. | HOLE INJECTING LAYER | HOLE TRANSPORTING LAYER | LIGHT-EMITTING LAYER | ELECTRON TRANSPORTING LAYER | EMITTED COLOR (CIEx, y) | LUMINOUS EFFICIENCY (cd/A) At100 cd/m$^2$ | WAVE-LENGTH (nm) | MAX LUMI-NANCE (cd/m$^2$) |
|---|---|---|---|---|---|---|---|---|
| 41 | CuPc | NPB | Alq + 5% Compound1 | Alq | Orange-Yellow x = 0.51, y = 0.48 | 8.5 | 583 | 39,900 |
| 42 | CuPc | NPB | Alq + 5% Compound2 | Alq | Orange-Yellow x = 0.52, y = 0.47 | 7.5 | 589 | 37,600 |
| 43 | CuPc | NPB | Alq + 5% Compound3 | Alq | Orange-Yellow x = 0.51, y = 0.48 | 8.5 | 583 | 39,700 |
| 44 | CuPc | NPB | Alq + 5% Compound4 | Alq | Orange-Yellow x = 0.51, y = 0.48 | 6.8 | 587 | 35,400 |
| 45 | CuPc | NPB | Alq + 5% Compound5 | Alq | Orange-Yellow x = 0.50, y = 0.50 | 5.5 | 579 | 32,100 |
| 46 | CuPc | NPB | Alq + 5% Compound6 | Alq | Orange-Yellow x = 0.51, y = 0.48 | 8.0 | 583 | 39,000 |
| 47 | CuPc | NPB | Alq + 5% Compound7 | Alq | Orange-Yellow x = 0.51, y = 0.48 | 8.6 | 583 | 40,000 |
| 48 | CuPc | NPB | Alq + 5% Compound8 | Alq | Orange-Yellow x = 0.51, y = 0.48 | 7.9 | 584 | 39,000 |
| 49 | CuPc | NPB | Alq + 5% Compound9 | Alq | Orange-Yellow x = 0.50, y = 0.50 | 6.9 | 570 | 33,300 |
| 50 | CuPc | NPB | Alq + 5% Compound10 | Alq | Orange-Yellow x = 0.52, y = 0.47 | 7.5 | 589 | 37,600 |
| 51 | CuPc | NPB | Alq + 5% Compound11 | Alq | Orange-Yellow x = 0.51, y = 0.48 | 6.5 | 579 | 34,000 |
| 52 | CuPc | NPB | Alq + 5% Compound12 | Alq | Orange-Yellow x = 0.51, y = 0.48 | 8.5 | 583 | 39,700 |
| 53 | CuPc | NPB | Alq + 5% Compound13 | Alq | Orange-Yellow x = 0.51, y = 0.48 | 8.0 | 580 | 39,000 |
| 54 | CuPc | NPB | Alq + 5% Compound14 | Alq | Orange-Yellow x = 0.51, y = 0.48 | 7.9 | 584 | 38,900 |

TABLE 8

| EX. | HOLE INJECTING LAYER | HOLE TRANSPORTING LAYER | LIGHT-EMITTING LAYER | ELECTRON TRANSPORTING LAYER | EMITTED-COLOR (CIEx, y) | LUMINOUS EFFICIENCY (cd/A) At 100 cd/m$^2$ | WAVE-LENGTH (nm) | MAX LUMI-NANCE (cd/m$^2$) |
|---|---|---|---|---|---|---|---|---|
| 55 | CuPc | NPB | Alq + 5% Compound15 | Alq | Orange-Yellow x = 0.51, y = 0.48 | 7.9 | 584 | 39,000 |
| 56 | CuPc | NPB | Alq + 5% Compound16 | Alq | Orange-Yellow x = 0.51, y = 0.48 | 8.5 | 583 | 39,900 |
| 57 | CuPc | NPB | Alq + 5% Compound17 | Alq | Orange-Yellow x = 0.51, y = 0.48 | 8.2 | 584 | 39,700 |
| 58 | CuPc | NPB | Alq + 5% Compound18 | Alq | Orange-Yellow x = 0.51, y = 0.48 | 7.9 | 585 | 39,100 |
| 59 | CuPc | NPB | Alq + 5% Compound19 | Alq | Orange-Yellow x = 0.51, y = 0.48 | 8.0 | 581 | 39,000 |
| 60 | CuPc | NPB | Alq + 5% Compound20 | Alq | Orange-Yellow x = 0.51, y = 0.48 | 8.0 | 585 | 39,500 |
| 61 | CuPc | NPB | Alq + 5% Compound21 | Alq | Green x = 0.30, y = 0.64 | 11.0 | 537 | 45,000 |
| 62 | CuPc | NPB | Alq + 5% Compound22 | Alq | Green x = 0.30, y = 0.64 | 9.8 | 536 | 41,000 |
| 63 | CuPc | NPB | Alq + 5% Compound23 | Alq | Green x = 0.30, y = 0.64 | 8.9 | 535 | 39,900 |
| 64 | CuPc | NPB | Alq + 5% Compound24 | Alq | Green x = 0.30, y = 0.64 | 11.0 | 537 | 45,000 |
| 65 | CuPc | NPB | Alq + 5% Compound25 | Alq | Green x = 0.30, y = 0.64 | 11.1 | 537 | 45,100 |
| 66 | CuPc | NPB | Alq + 5% Compound26 | Alq | Green x = 0.29, y = 0.65 | 8.1 | 529 | 40,500 |
| 67 | CuPc | NPB | Alq + 5% Compound27 | Alq | Red x = 0.65, y = 0.35 | 2.0 | 648 | 11,000 |

As shown in Tables 7 and 8, the organic EL devices of Examples 41-60 provided orange-yellow light emission. The organic EL devices of Examples 61-66 provided green light emission. The organic EL device of Example 67 provided red light emission. The organic EL devices of Examples 41-67 provided high luminous efficiency and high maximum luminance. This shows that using the rubrene derivatives as light emitting dopants when Alq is used as the host material is effective in enhancing the luminous efficiency and maximum luminance.

Tables 9 and 10 show measurements of luminescence characteristics of the organic EL devices of Examples 68-94.

TABLE 9

| EX. | HOLE INJECTING LAYER | HOLE TRANSPORTING LAYER | LIGHT-EMITTING LAYER | ELECTRON TRANSPORTING LAYER | EMITTED COLOR (CIEx, y) | LUMINOUS EFFICIENCY (cd/A) At 100 cd/m$^2$ | WAVE-LENGTH (nm) | MAX LUMI-NANCE (cd/m$^2$) |
|---|---|---|---|---|---|---|---|---|
| 68 | CuPc | NPB | NPB + 5% Compound1 | Alq | Orange-Yellow x = 0.49, y = 0.51 | 12.5 | 559 | 46,600 |
| 69 | CuPc | NPB | NPB + 5% Compound2 | Alq | Orange-Yellow x = 0.51, y = 0.48 | 9.6 | 572 | 38,800 |
| 70 | CuPc | NPB | NPB + 5% Compound3 | Alq | Orange-Yellow x = 0.49, y = 0.51 | 10.1 | 561 | 39,100 |
| 71 | CuPc | NPB | NPB + 5% Compound4 | Alq | Orange-Yellow x = 0.51, y = 0.48 | 9.0 | 570 | 37,200 |

TABLE 9-continued

| EX. | HOLE INJECTING LAYER | HOLE TRANSPORTING LAYER | LIGHT-EMITTING LAYER | ELECTRON TRANSPORTING LAYER | EMITTED COLOR (CIEx, y) | LUMINOUS EFFICIENCY (cd/A) At100 cd/m$^2$ | WAVE-LENGTH (nm) | MAX LUMI-NANCE (cd/m$^2$) |
|---|---|---|---|---|---|---|---|---|
| 72 | CuPc | NPB | NPB + 5% Compound5 | Alq | Orange-Yellow x = 0.48, y = 0.52 | 6.8 | 558 | 31,000 |
| 73 | CuPc | NPB | NPB + 5% Compound6 | Alq | Orange-Yellow x = 0.49, y = 0.51 | 10.1 | 560 | 40,100 |
| 74 | CuPc | NPB | NPB + 5% Compound7 | Alq | Orange-Yellow x = 0.49, y = 0.51 | 12.3 | 559 | 45,700 |
| 75 | CuPc | NPB | NPB + 5% Compound8 | Alq | Orange-Yellow x = 0.50, y = 0.50 | 9.3 | 561 | 37,800 |
| 76 | CuPc | NPB | NPB + 5% Compound9 | Alq | Yellow x = 0.47, y = 0.53 | 7.8 | 555 | 33,000 |
| 77 | CuPc | NPB | NPB + 5% Compound10 | Alq | Orange-Yellow x = 0.51, y = 0.48 | 9.6 | 572 | 38,800 |
| 78 | CuPc | NPB | NPB + 5% Compound11 | Alq | Orange-Yellow x = 0.49, y = 0.51 | 7.8 | 562 | 33,100 |
| 79 | CuPc | NPB | NPB + 5% Compound12 | Alq | Orange-Yellow x = 0.49, y = 0.51 | 11.1 | 563 | 42,000 |
| 80 | CuPc | NPB | NPB + 5% Compound13 | Alq | Orange-Yellow x = 0.49, y = 0.51 | 10.0 | 564 | 39,900 |
| 81 | CuPc | NPB | NPB + 5% Compound14 | Alq | Orange-Yellow x = 0.50, y = 0.50 | 9.3 | 561 | 37,600 |

TABLE 10

| EX. | HOLE INJECTING LAYER | HOLE TRANSPORTING LAYER | LIGHT-EMITTING LAYER | ELECTRON TRANSPORTING LAYER | EMITTED COLOR (CIEx, y) | LUMINOUS EFFICIENCY (cd/A) At100 cd/m$^2$ | WAVE-LENGTH (nm) | MAX LUMI-NANCE (cd/m$^2$) |
|---|---|---|---|---|---|---|---|---|
| 82 | CuPc | NPB | NPB + 5% Compound15 | Alq | Orange-Yellow x = 0.50, y = 0.50 | 9.4 | 562 | 38,000 |
| 83 | CuPc | NPB | NPB + 5% Compound16 | Alq | Orange-Yellow x = 0.49, y = 0.51 | 12.5 | 559 | 46,500 |
| 84 | CuPc | NPB | NPB + 5% Compound17 | Alq | Orange-Yellow x = 0.49, y = 0.51 | 12.0 | 561 | 46,000 |
| 85 | CuPc | NPB | NPB + 5% Compound18 | Alq | Orange-Yellow x = 0.49, y = 0.51 | 11.5 | 560 | 43,400 |
| 86 | CuPc | NPB | NPB + 5% Compound19 | Alq | Orange-Yellow x = 0.49, y = 0.51 | 10.0 | 563 | 39,900 |
| 87 | CuPc | NPB | NPB + 5% Compound20 | Alq | Orange-Yellow x = 0.49, y = 0.51 | 12.0 | 561 | 46,100 |
| 88 | CuPc | NPB | NPB + 5% Compound21 | Alq | Green x = 0.29, y = 0.67 | 13.0 | 535 | 52,000 |
| 89 | CuPc | NPB | NPB + 5% Compound22 | Alq | Green x = 0.29, y = 0.67 | 10.0 | 536 | 42,000 |
| 90 | CuPc | NPB | NPB + 5% Compound23 | Alq | Green x = 0.29, y = 0.67 | 9.1 | 534 | 38,200 |
| 91 | CuPc | NPB | NPB + 5% Compound24 | Alq | Green x = 0.29, y = 0.67 | 12.5 | 535 | 50,100 |
| 92 | CuPc | NPB | NPB + 5% Compound25 | Alq | Green x = 0.29, y = 0.67 | 12.0 | 535 | 47,000 |

TABLE 10-continued

| EX. | HOLE INJECTING LAYER | HOLE TRANSPORTING LAYER | LIGHT-EMITTING LAYER | ELECTRON TRANSPORTING LAYER | EMITTED COLOR (CIEx, y) | LUMINOUS EFFICIENCY (cd/A) At 100 cd/m$^2$ | WAVE-LENGTH (nm) | MAX LUMI-NANCE (cd/m$^2$) |
|---|---|---|---|---|---|---|---|---|
| 93 | CuPc | NPB | NPB + 5% Compound26 | Alq | Green x = 0.30, y = 0.65 | 9.8 | 539 | 38,500 |
| 94 | CuPc | NPB | NPB + 5% Compound27 | Alq | Red x = 0.65, y = 0.35 | 2.1 | 645 | 16,100 |

As shown in Tables 9 and 10, the organic EL devices of Examples 68-87 provided orange-yellow light emission. The organic EL devices of Examples 88-93 provided green light emission. The organic EL device of Example 94 provided red light emission. The organic EL devices of Examples 68-94 provided high luminous efficiency and high maximum luminance. This shows that using the rubrene derivatives as light emitting dopants when NPB is used as a host material is effective in enhancing the luminous efficiency and maximum luminance.

Table 11 shows measurements of luminescence characteristics of the organic EL devices of Examples 95-108.

TABLE 11

| EX. | HOLE INJECTING LAYER | HOLE TRANSPORTING LAYER | 1st LIGHT-EMITTING LAYER | 2nd LIGHT-EMITTING LAYER | ELECTRON TRANSPORTING LAYER | EMITTED COLOR (CIEx, y) | LUMINOUS EFFICIENCY (cd/A) At 100 cd/m$^2$ | WAVE-LENGTH (nm) | MAX LUMINANCE (cd/m$^2$) |
|---|---|---|---|---|---|---|---|---|---|
| 95 | CuPc | NPB | NPB + 2% Compound1 | Diphenylanthracene + 2% Perylene | Alq | White x = 0.35, y = 0.34 | 15.0 | 489,560 | 66,000 |
| 96 | CuPc | NPB | NPB + 2% Compound1 | Dianthrarylanthracene + 2% Perylene | Alq | White x = 0.35, y = 0.34 | 15.0 | 489,560 | 66,000 |
| 97 | CuPc | NPB | NPB + 2% Compound3 | Dianthrarylanthracene + 2% Perylene | Alq | White x = 0.35, y = 0.34 | 14.1 | 490,560 | 61,000 |
| 98 | CuPc | NPB | NPB + 2% Compound7 | Dianthrarylanthracene + 2% Perylene | Alq | White x = 0.35, y = 0.34 | 15.3 | 489,560 | 67,000 |
| 99 | CuPc | NPB | NPB + 2% Compound8 | Diphenylanthracene + 2% Perylene | Alq | White x = 0.35, y = 0.34 | 12.0 | 489,563 | 49,800 |
| 100 | CuPc | NPB | NPB + 2% Compound16 | Dianthrarylanthracene + 2% Perylene | Alq | White x = 0.35, y = 0.34 | 15.6 | 489,560 | 68,000 |
| 101 | CuPc | NPB | NPB + 2% Compound17 | Dianthrarylanthracene + 2% Perylene | Alq | White x = 0.35, y = 0.35 | 14.5 | 489,561 | 62,000 |
| 102 | CuPc | NPB | NPB + 2% Compound18 | Dianthrarylanthracene + 2% Perylene | Alq | White x = 0.34, y = 0.36 | 12.2 | 489,566 | 50,000 |
| 103 | CuPc | NPB | NPB + 2% Compound19 | Dianthrarylanthracene + 2% Perylene | Alq | White x = 0.35, y = 0.36 | 14.7 | 489,568 | 62,000 |
| 104 | CuPc | NPB | NPB + 2% Compound20 | Dianthrarylanthracene + 2% Perylene | Alq | White x = 0.35, y = 0.34 | 14.5 | 489,560 | 61,700 |
| 105 | CuPc | NPB | NPB + 5% Compound1 + 3% Compound94 | Dianthrarylanthracene + 2% Perylene | Alq | White x = 0.33, y = 0.33 | 16.1 | 490,560 | 73,000 |
| 106 | CuPc | NPB | NPB + 5% Compound1 + 3% Compound136 | Dianthrarylanthracene + 2% Perylene | Alq | White x = 0.33, y = 0.33 | 16.5 | 490,560 | 75,000 |
| 107 | CuPc | NPB | NPB + 5% Compound1 + 3% Compound137 | Dianthrarylanthracene + 2% Perylene | Alq | White x = 0.34, y = 0.33 | 16.2 | 490,560 | 73,000 |
| 108 | CuPc | NPB | NPB + 5% Compound1 + 3% Compound138 | Dianthrarylanthracene + 2% Perylene | Alq | White x = 0.34, y = 0.34 | 16.0 | 490,560 | 72,000 |

As shown in Table 11, the organic EL devices of Examples 95-108 provided white light emission. The organic EL devices of Examples 95-108 provided high luminous efficiency and high maximum luminance. This shows that using the rubrene derivatives as light emitting dopants in the first light emitting layer is effective in enhancing the luminous efficiency and maximum luminance.

In particular, Examples 105-108 used two kinds of light emitting dopants in the first light emitting layer: an orange-emitting rubrene derivative and a green-emitting rubrene derivative, whereby the luminous efficiency of white and the color purity of white were enhanced.

Thus, it was seen from Examples 34-108 that using the rubrene derivatives shown above as a light emitting dopant or light-emission assisting dopant in a light emitting layer improves luminous efficiency and luminance.

The invention claimed is:

1. An organic electroluminescent device comprising:
a hole injecting electrode;
an electron injecting electrode; and
a light emitting layer provided between said hole injecting electrode and said electron injecting electrode,
said light emitting layer containing a rubrene derivative 5,12-bis(4-(6-methylbenzothiazole-2-yl)phenyl)-6,11-diphenylnaphthacene represented by Formula (A2)

(A2)

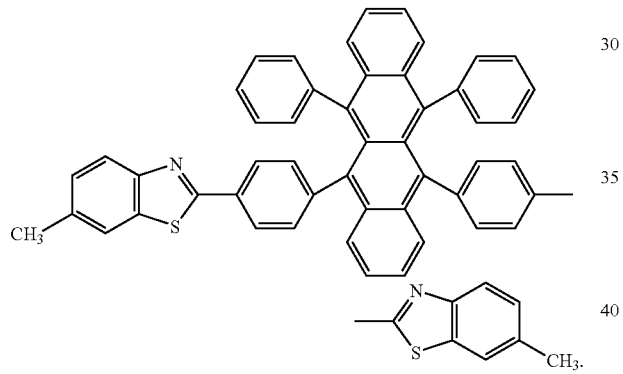

2. The organic electroluminescent device according to claim 1, wherein said light emitting layer contains a host material, a light emitting dopant, and a first light-emission assisting dopant, and said first light-emission assisting dopant is composed of said rubrene derivative.

3. The organic electroluminescent device according to claim 2, wherein said light emitting layer further contains a second light-emission assisting dopant.

4. The organic electroluminescent device according to claim 1, wherein said light emitting layer contains a host material and a light emitting dopant, and said light emitting dopant is composed of said rubrene derivative.

5. The organic electroluminescent device according to claim 2, wherein the content of said light emitting dopant is not less than 0.1 percent by weight nor more than 50 percent by weight, with respect to said host material.

6. An organic electroluminescent device comprising: a hole injecting electrode; an electron injecting electrode; and a light emitting layer provided between said hole injecting electrode and said electron injecting electrode, said light emitting layer containing a rubrene derivative 5,6,11,12-tetrakis(4-tert-butylphenyl)-naphthacene represented by (A3)

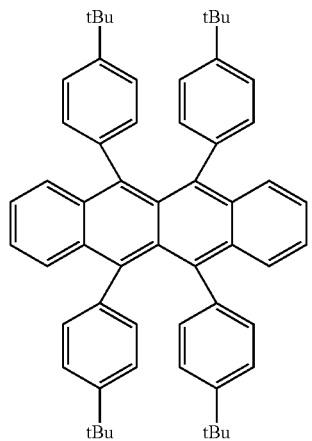

7. An organic electroluminescent device comprising: a hole injecting electrode; an electron injecting electrode; and a light emitting layer provided between said hole injecting electrode and said electron injecting electrode, said light emitting layer comprising, a first light emitting layer that contains a compound having a molecular structure represented by Formula (C1), and a second light emitting layer that contains a luminescent material that emits blue light;

(C1)

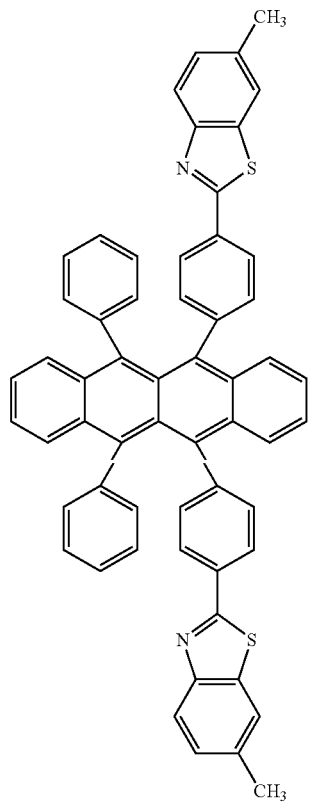

8. An organic electroluminescent device comprising: a hole injecting electrode; an electron injecting electrode; and a light emitting layer provided between said hole injecting electrode and said electron injecting electrode, said light emitting layer comprising a first light emitting layer that contains at least one compound selected from the group consisting of compounds having molecular structures represented by Formulas (C1)-(C20) and at least one compound selected from the group consisting of compounds represented by Formulas (A4)-(A7), (A10), and (C21)-(C27), and a second light emitting layer that contains a luminescent material that emits blue light;
(C1)
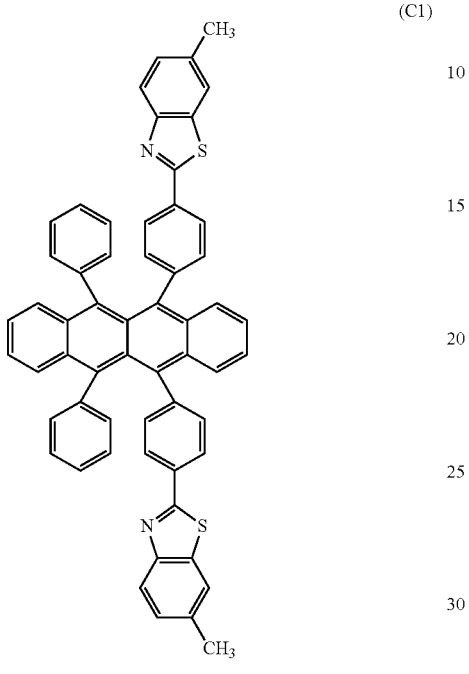
(C2)
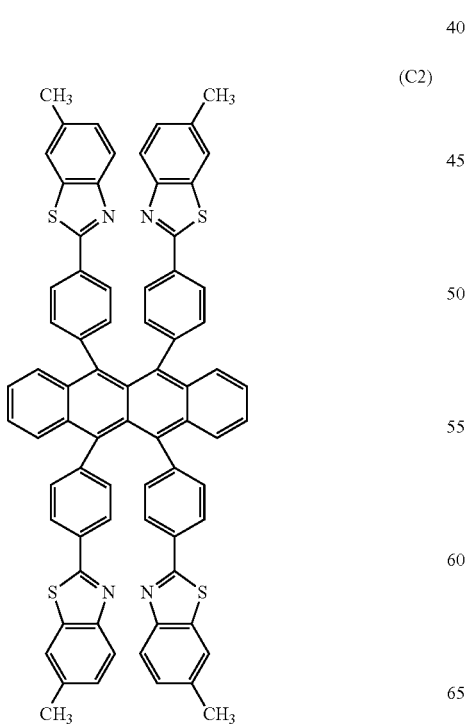
(C3)
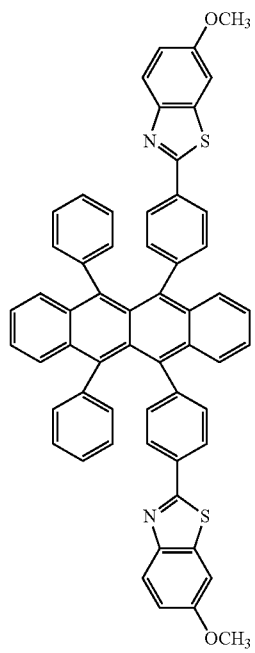
(C4)
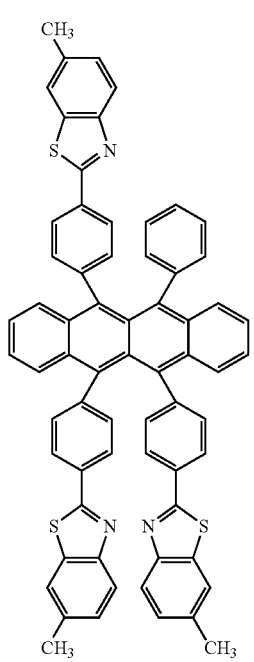

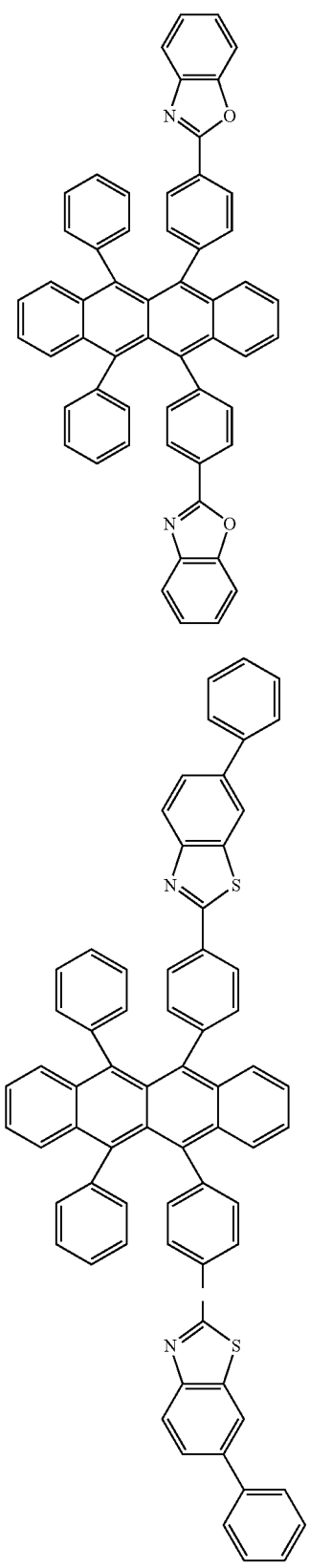
(C5)
(C6)
(C7)
(C8)

-continued
(C9)
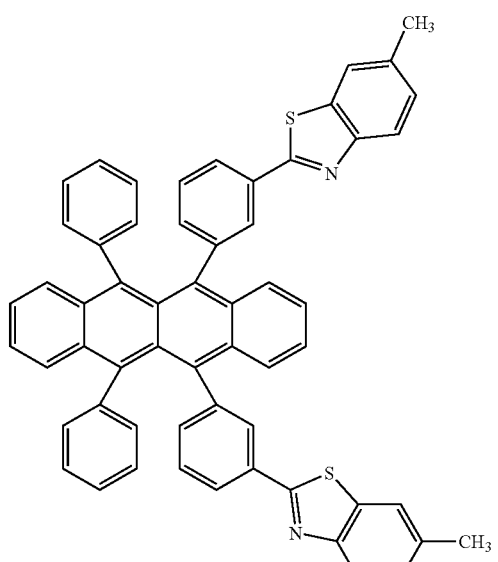
(C11)
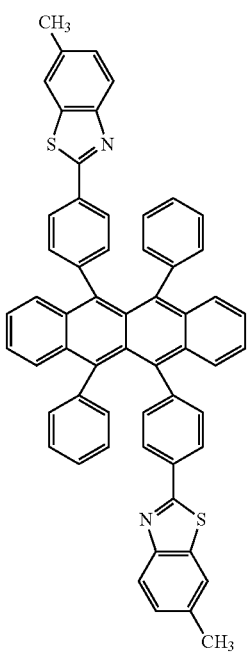
(C10)
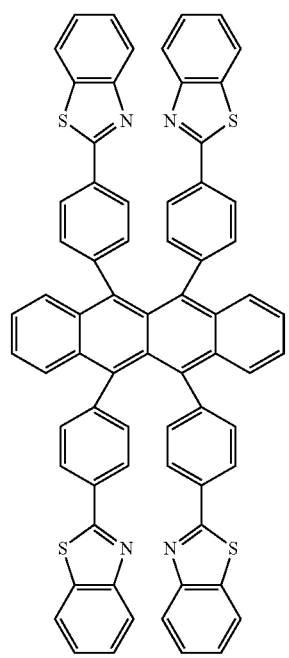
(C12)
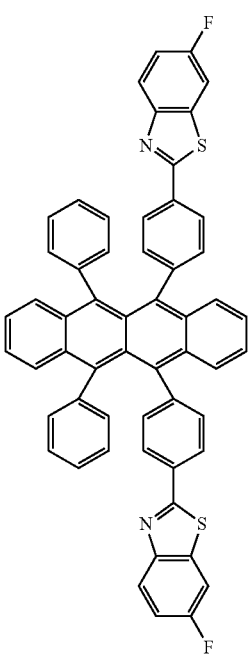

-continued
(C13)
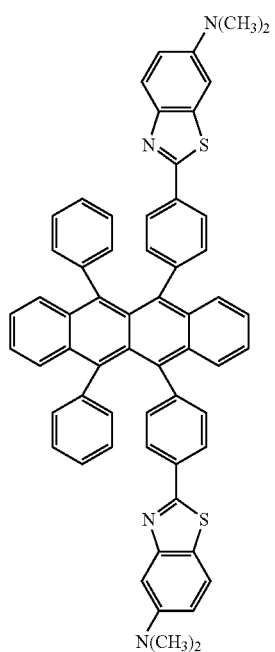
(C15)
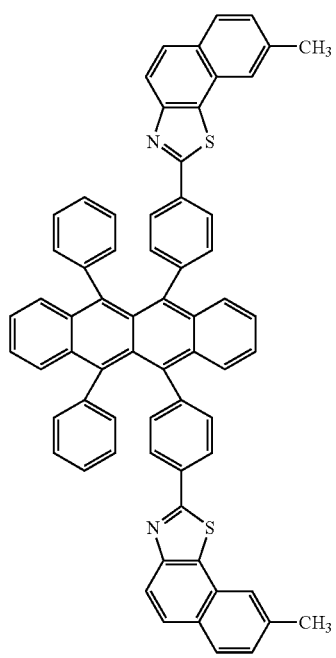
(C14)
(C16)
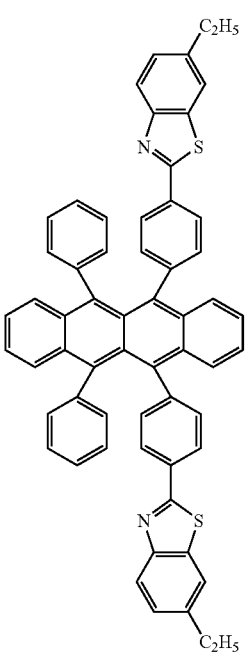

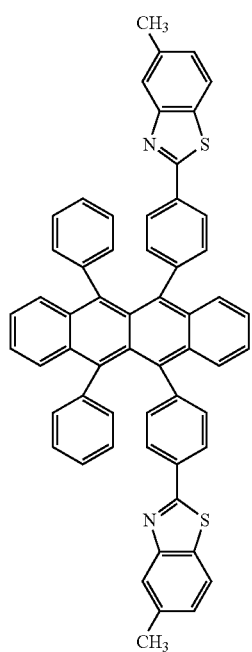
(C17)
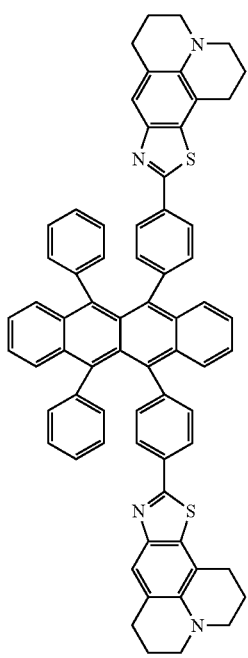
(C19)
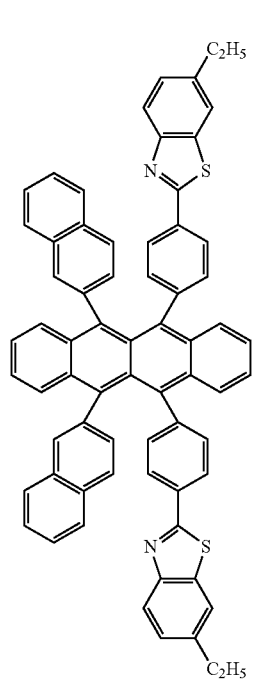
(C18)
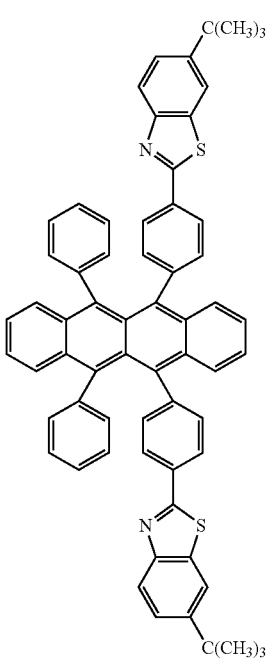
(C20)

-continued
(A4)
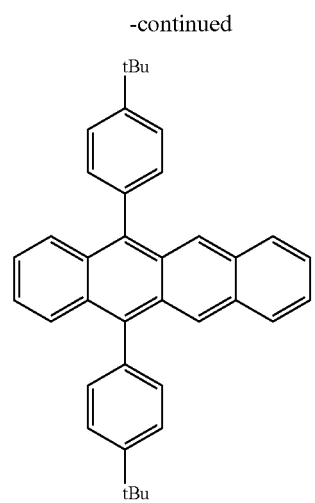
(A5)
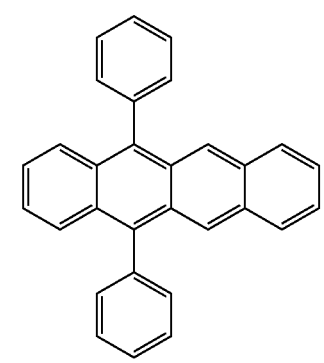
(A7)
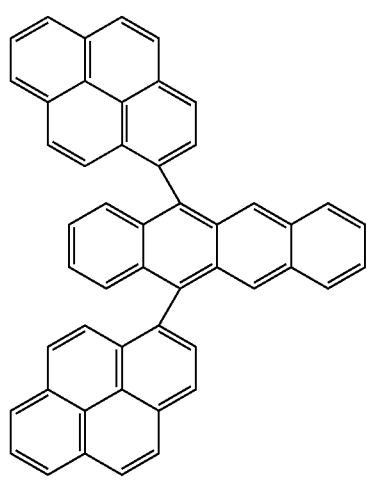
-continued
(A6)
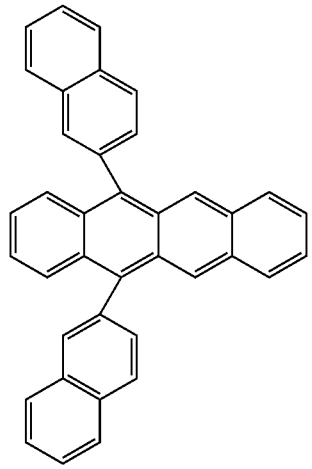
(A10)
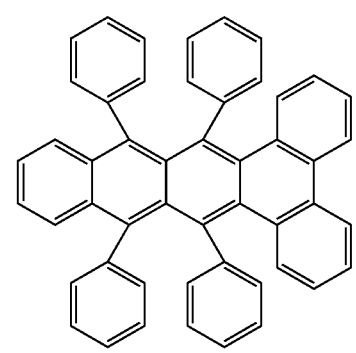
(C21)
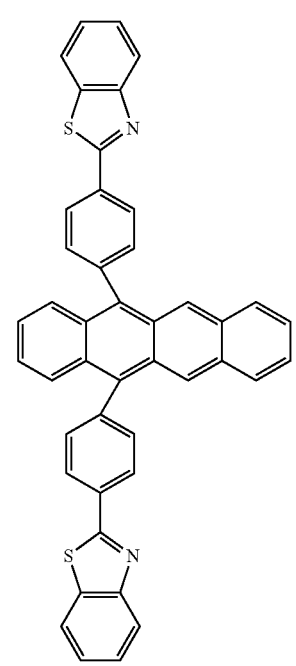

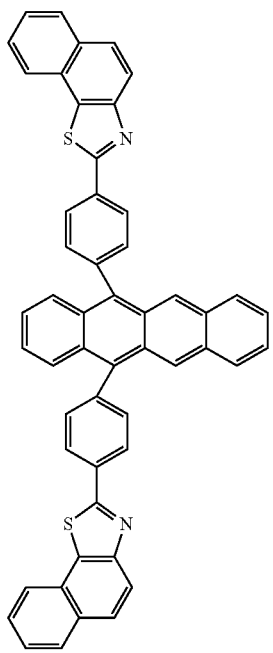
(C22)
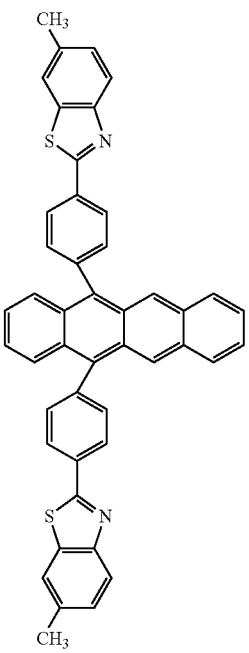
(C24)
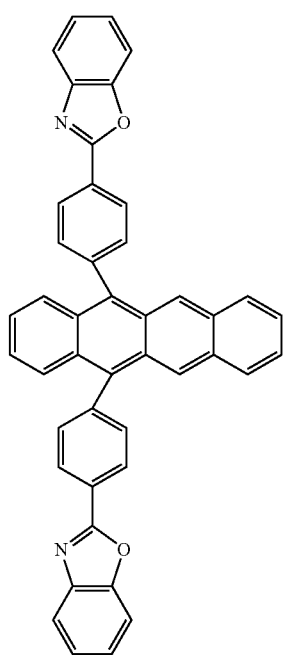
(C23)
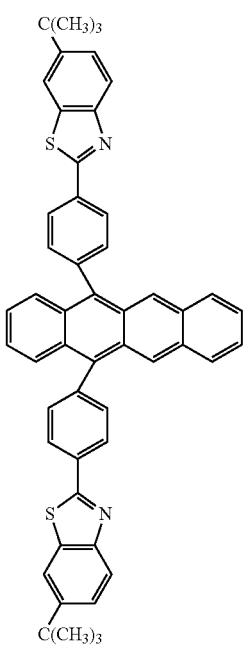
(C25)

(C26)
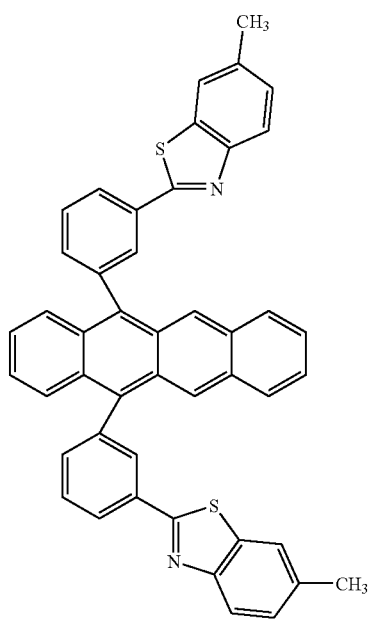
(C27)
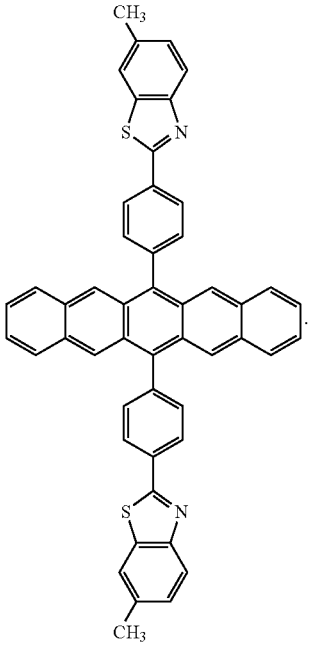
* * * * *